United States Patent [19]

Purcell et al.

[11] Patent Number: 5,598,483
[45] Date of Patent: Jan. 28, 1997

[54] MPEG VIDEO DECOMPRESSION PROCESSOR

[75] Inventors: Stephen C. Purcell, Mountain View; David E. Galbi, Santa Clara; Frank H. Liao, Sunnyvale; Yvonne C. Tse, Fremont, all of Calif.

[73] Assignee: C-Cube Microsystems, Inc., Milpitas, Calif.

[21] Appl. No.: 297,722

[22] Filed: Oct. 24, 1994

Related U.S. Application Data

[62] Division of Ser. No. 46,474, Apr. 13, 1993, Pat. No. 5,379,356.

[51] Int. Cl.$^6$ .................................................. G06K 9/36
[52] U.S. Cl. .................................................. 382/232
[58] Field of Search ........................ 382/232, 236, 382/238, 239; 348/403, 407, 413

[56] References Cited

U.S. PATENT DOCUMENTS

| | | | |
|---|---|---|---|
| 4,703,349 | 10/1987 | Bernstein | 358/133 |
| 4,748,511 | 5/1988 | Nichols et al. | 358/256 |
| 4,827,338 | 5/1989 | Gerard | 358/136 |
| 4,897,717 | 1/1990 | Hamilton et al. | 358/133 |
| 4,969,040 | 11/1990 | Gharavi | 358/136 |
| 4,974,078 | 11/1990 | Tsai | 358/133 |
| 5,057,918 | 10/1991 | Denoyelle | 358/135 |
| 5,136,371 | 8/1992 | Savatier | 358/133 |

OTHER PUBLICATIONS

Article entitled "A Chip Set Core For Image Compression" by Alain Artieri, Oswald Colavin, IEEE Transactions on Consumer Electronics, Aug. 1990, No. 3, New York, pp. 395–402.

Article entitled "A Parallel Architecture For Real–Time Video Coding" by Luis de Sa, Vitor Silva, etc., Microprocessing and Microprogramming Proc. Euromicro 90, Aug. 1990, Nos. 1/5, Amsterdam, NL, pp. 439–445.

Excerpt from book entitled "International Conference on Systolic Arrays", May 25–27, 1988, A Multiprocessor System Utilizing Enhanced DSP's For Image Processing by Hirota Ueda, etc., 1988 IEEE, pp. 611–620.

Article entitled "A General Architecture of Video Codec For Real Time Communication at 64 kbit/s" by M. Balestri and A. Rinaudo, Signal Processing Image Communication, Oct. 1989, No. 2, Amsterdam, NE, pp. 239–243.

*Primary Examiner*—Jose L. Couso
*Attorney, Agent, or Firm*—Skjerven, Morrill, MacPherson, Franklin & Friel; Edward C. Kwok

[57] ABSTRACT

A method and a structure are provided to decode intra-frame and interframe coded compressed video data. In one embodiment of the present invention, a decompression structure having a processor is provided with a global bus over which a decoder coprocessor, an inverse discrete cosine transform coprocessor and a motion compensation coprocessor communicate. The decompression structure in accordance with the present invention communicates with a host computer over a host bus and with an external dynamic random access memory over a memory bus. The processor in the decompression structure of the present invention provides overall control to the decoder, IDCT and motion compensation coprocessors by reading and writing into a plurality of data and control registers, each register associated with one of the decoder, the IDCT and the motion compensation coprocessors.

4 Claims, 33 Drawing Sheets op:  2-bit major operation ( arith, shift, LD, ST )
d:   1-bit destination control ( local, global )
opc: 3-bit minor opcode
C:   5-bit destination register
B:   5-bit source register
src: 2-bit Atype ( 0:RegA, 1:imm5 (A), 2:imm14 (or,J, A)
br:  4-bit branch control
J:   5-bit jump target
A:   5-bit source register ( or imm literal )

FIG. 8B (Octal) Byte Addresses (2 per Pixel)

Screen addresses in a 16 x 16 Macro Block

```
         000  002  100  102  200  202  300  302  400  402  500  502  600  602  700  702
     4 {  004  006  104  106  204  206  304  306  404  406  504  506  604  606  704  706
         010  012  110  112  210  212  310  312  410  412  510  512  610  612  710  712
         014  016  114  116  214  216  314  316  414  416  514  516  614  616  714  716
         020  022  120  122  220  222  320  322  420  422  520  522  620  622  720  722
         024  026  124  126  224  226  324  326  424  426  524  526  624  626  724  726
         030  032  130  132  230  232  330  332  430  432  530  532  630  632  730  732
         034  036  134  136  234  236  334  336  434  436  534  536  634  636  734  736
         040  042  140  142  240  242  340  342  440  442  540  542  640  642  740  742
         044  046  144  146  244  246  344  346  444  446  544  546  644  646  744  746
         050  052  150  152  250  252  350  352  450  452  550  552  650  652  750  752
         054  056  154  156  254  256  354  356  454  456  554  556  654  656  754  756
         060  062  160  162  260  262  360  362  460  462  560  562  660  662  760  762
         064  066  164  166  264  266  364  366  464  466  564  566  664  666  764  766
         070  072  170  172  270  272  370  372  470  472  570  572  670  672  770  772
         074  076  174  176  274  276  374  376  474  476  574  576  674  676  774  776
```

Memory Word byte Addressing

| Adr | MDATA [63:32] | MDATA [31:0] |
|---|---|---|
| 000: | 000, 001, 002, 003, | 004, 005, 006, 007, |
| 010: | 010, 011, 012, 013, | 014, 015, 016, 017, |
| ::: | | |
| 070: | 070, 071, 072, 073, | 074, 075, 076, 077, |
| 100: | 104, 105, 106, 107, | 100, 101, 102, 103, |
| 110: | 114, 115, 116, 117, | 110, 111, 112, 113, |

SPECIAL (Scan Line) Addressing:

| Adr | MDATA [63:32] | MDATA [31:0] |
|---|---|---|
| 000: | 000, 001, 002, 003, | 100, 101, 102, 103, |
| 010: | 010, 011, 012, 013, | 110, 111, 112, 113, |
| ::: | | |
| 070: | 070, 071, 072, 073, | 170, 171, 172, 173, |
| 100: | 104, 105, 106, 107, | 004, 005, 006, 007, |
| 110: | 114, 115, 116, 117, | 014, 015, 016, 017, |

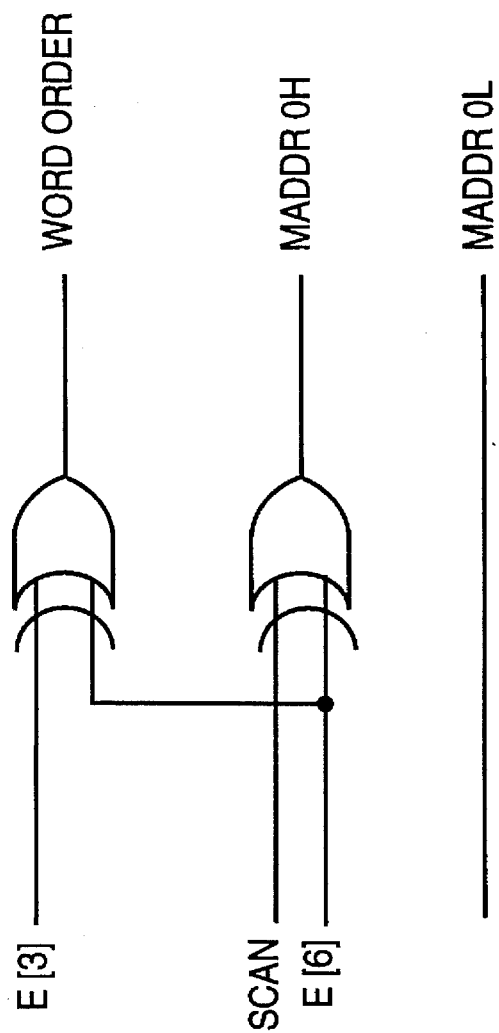

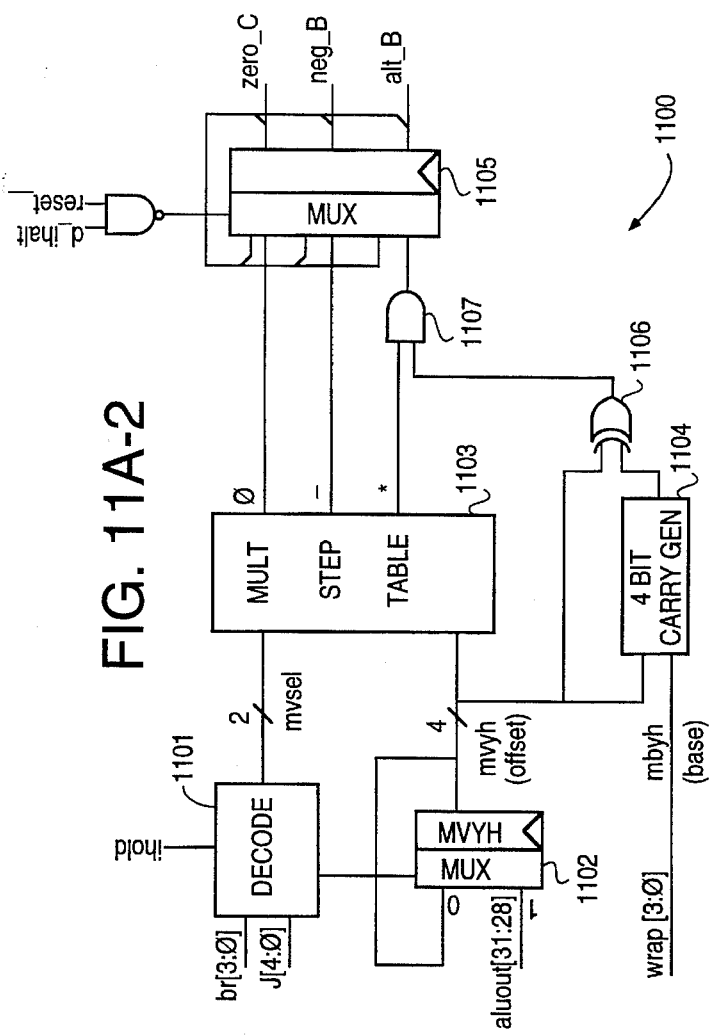
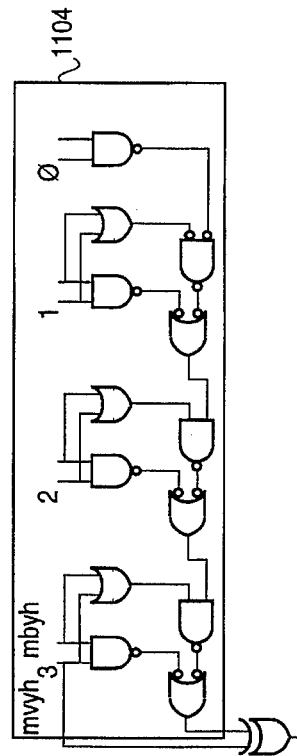
FIG. 11A-2
FIG. 11A-3
FIG. 11A-1

|    |    |    |    |    |    |    |    |
|----|----|----|----|----|----|----|----|
| 00 | 01 | 02 | 03 | 04 | 05 | 06 | 07 |
| 10 | 11 | 12 | 13 | 14 | 15 | 16 | 17 |

FIG. 12A

|    |    |    |    |    |    |    |
|----|----|----|----|----|----|----|
| 00 | 02 | 04 | 06 | 10 | 12 | 14 | 16 |
| 01 | 03 | 05 | 07 | 11 | 13 | 15 | 17 |

FIG. 12B

| 00 | 04 | 10 | 14 | 01 | 05 | 11 | 15 |
| 02 | 06 | 12 | 16 | 03 | 07 | 13 | 17 |

FIG. 12C

| 00 | 10 | 01 | 11 | 02 | 12 | 03 | 13 |
| 04 | 14 | 05 | 15 | 06 | 16 | 07 | 17 |

FIG. 12D

|  | OUTPUT | | | |
|---|---|---|---|---|
| INPUT | ROTATE 0<br>(PATTERN 0) | ROTATE 1<br>(PATTERN 1) | ROTATE 2<br>(PATTERN 2) | ROTATE 3<br>(PATTERN 3) |
| 0 0 0 0 | 0 0 0 0 | 0 0 0 0 | 0 0 0 0 | 0 0 0 0 |
| 0 0 0 1 | 0 0 0 1 | 1 0 0 0 | 0 1 0 0 | 0 0 1 0 |
| 0 0 1 0 | 0 0 1 0 | 0 0 0 1 | 1 0 0 0 | 0 1 0 0 |
| 0 0 1 1 | 0 0 1 1 | 1 0 0 1 | 1 1 0 0 | 0 1 1 0 |
| 0 1 0 0 | 0 1 0 0 | 0 0 1 0 | 0 0 0 1 | 1 0 0 0 |
| 0 1 0 1 | 0 1 0 1 | 1 0 1 0 | 0 1 0 1 | 1 0 1 0 |
| 0 1 1 0 | 0 1 1 0 | 0 0 1 1 | 1 0 0 1 | 1 1 0 0 |
| 0 1 1 1 | 0 1 1 1 | 1 0 1 1 | 1 1 0 1 | 1 1 1 0 |
| 1 0 0 0 | 1 0 0 0 | 0 1 0 0 | 0 0 1 0 | 0 0 0 1 |
| 1 0 0 1 | 1 0 0 1 | 1 1 0 0 | 0 1 1 0 | 0 0 1 1 |
| 1 0 1 0 | 1 0 1 0 | 0 1 0 1 | 1 0 1 0 | 0 1 0 1 |
| 1 0 1 1 | 1 0 1 1 | 1 1 0 1 | 1 1 1 0 | 0 1 1 1 |
| 1 1 0 0 | 1 1 0 0 | 0 1 1 0 | 0 0 1 1 | 1 0 0 1 |
| 1 1 0 1 | 1 1 0 1 | 1 1 1 0 | 0 1 1 1 | 1 0 1 1 |
| 1 1 1 0 | 1 1 1 0 | 0 1 1 1 | 1 0 1 1 | 1 1 0 1 |
| 1 1 1 1 | 1 1 1 1 | 1 1 1 1 | 1 1 1 1 | 1 1 1 1 |

FIG. 12E

MPEG VIDEO DECOMPRESSION PROCESSOR

This application is a division of application Ser. No. 08/046,474, filed Apr. 13, 1993 now U.S. Pat. No. 5,279,356.

BACKGROUND OF THE INVENTION

1. Field of the Invention

This invention relates to the field of digital signal processing, and in particular relates to the processing of digital video signals.

2. Description of Related Arts

Motion pictures are provided at thirty frames per second to create the illusion of continuous motion. Since each picture is made up of thousands of pixels, the amount of storage necessary for storing even a short motion sequence is enormous. As higher definition is desired, the number of pixels in each picture is expected to grow also. Fortunately, taking advantage of special properties of the human visual system, lossy compression techniques have been developed to achieve very high data compression without loss of perceived picture quality. (A lossy compression technique involves discarding information not essential to achieve the target picture quality). Nevertheless, the decompression processor is required to reconstruct in real time every pixel of the stored motion sequence.

The Motion Picture Experts Group (MPEG) is charged with providing a standard (hereinbelow "MPEG standard") for achieving compatibility between compression and decompression equipment. This standard specifies both the coded digital representation of video signal for the storage media, and the method for decoding. The representation supports normal speed playback, as well as other play modes of color motion pictures, and reproduction of still pictures. The standard covers the common 525- and 625-line television, personal computer and workstation display formats. The MPEG standard is intended for equipment supporting continuous transfer rate of up to 1.5 Mbits per second, such as compact disks, digital audio tapes, or magnetic hard disks. The MPEG standard is intended to support picture frames of approximately 288×352 pixels each at a rate between 24 Hz and 30 Hz. A publication by MPEG entitled "Coding for Moving Pictures and Associated Audio for digital storage medium at 1.5 Mbit/s," included herein as Appendix A, provides in draft form the proposed MPEG standard, which is hereby incorporated by reference in its entirety to provide detailed information about the MPEG standard.

Under the MPEG standard, the picture frame is divided into a series of "Macroblock slices" (MBS), each MBS containing a number of picture areas (called "macroblocks") each covering an area of 16×16 pixels. Each of these picture areas is represented by one or more 8×8 matrices which elements are the spatial luminance and chrominance values. In one representation (4:2:2 of the macroblock, a luminance value (Y type) is provided for every pixel in the 16×16 pixels picture area (in four 8×8 "Y" matrices), and chrominance values of the U and V (i.e., blue and red chrominance) types, each covering the same 16×16 picture area, are respectively provided in two 8×8 "U" and two 8×8 "V" matrices. That is, each 8×8 U or V matrix covers an area of 8×16 pixels. In another representation (4:2:0), a luminance value is provided for every pixel in the 16×16 pixels picture area, and one 8×8 matrix for each of the U and V types is provided to represent the chrominance values of the 16×16 pixels picture area. A group of four contiguous pixels in a 2×2 configuration is called a "quad pixel"; hence, the macroblock can also be thought of as comprising 64 quad pixels in an 8×8 configuration.

The MPEG standard adopts a model of compression and decompression shown in FIG. 1. As shown in FIG. 1, interframe redundancy (represented by block 101) is first removed from the color motion picture frames. To achieve interframe redundancy removal, each frames is designated either "intra", "predicted", or "interpolated" for coding purpose. Intra frames are least frequently provided, the predicted frames are provided more frequently than the intra frames, and all the remaining frames are interpolated frames. The values of every pixels in an intra frame ("I-picture") is independently provided. In a prediction frame ("P-picture"), only the incremental changes in pixel values from the last I-picture or P-picture are coded. In an interpolation frame ("B-picture"), the pixel values are coded with respect to both an earlier frame and a later frame. Note that the MPEG standard does not require frames to be stored in strict time sequence, such that the intraframe from which a predicted frame is coded can be provided in the picture sequence either earlier or later in time as the predicted frame. By coding frames incrementally, using predicted and interpolated frames, much interframe redundancy can be eliminated to result in tremendous savings in storage. Motion of an entire macroblock can be coded by a motion vector, rather than at the pixel level, thereby providing further data compression.

The next steps in compression under the MPEG standard remove intraframe redundancy. In the first step, represented by block 102 of FIG. 1, a 2-dimensional discrete cosine transform (DCT) is performed on each of the 8×8 values matrices to map the spatial luminance or chrominance values into the frequency domain.

Next, represented by block 103 of FIG. 1, a process called "quantization" weights each element of the 8×8 matrix in accordance with its chrominance or luminance type and its frequency. In an I-picture, the quantization weights are intended to reduce to one many high frequency components to which the human eye is not sensitive. In P-and B-pictures, which contain mostly higher frequency components, the weights are not related to visual perception. Having created many zero elements in the 8×8 matrix, each matrix can now be represented without information loss as an ordered list of a "DC" value, and alternating pairs of a non-zero "AC" value and a length of zero elements following the non-zero value. The list is ordered such that the elements of the matrix are presented as if the matrix is read in a zig_zag manner (i.e., the elements of a matrix A are read in the order A00, A01, A10, A02, A11, A20 etc.). This representation is space efficient because zero elements are not represented individually.

Finally, an entropy encoding scheme, represented by block 104 in FIG. 1, is used to further compress the representations of the DC block coefficients and the AC value-run length pairs using variable length codes. Under the entropy encoding scheme, the more frequently occurring symbols are represented by shorter codes. Further efficiency in storage is thereby achieved.

Decompression under MPEG is shown by blocks 105–108 in FIG. 1. In decompression, the processes of entropy encoding, quantization and DCT are reversed, as shown respectively in blocks 105–107. The final step, called "absolute pixel generation", (block 108), provides the actual pixels for reproduction, in accordance to the play mode (forward, reverse, slow motion e.g.), and the physical dimensions and attributes of the display used.

Further, since the MPEG standard is provided only for noninterlaced video signal, in order to display the output motion picture on a conventional NTSC or PAL television set, the decompressor must provide the output video signals in the conventional interlaced fields. Guidelines for decompression for interlaced television signals have been proposed as an extension to the MPEG standard. This extended standard is compatible with the International Radio Consultative Committee (CCIR) recommendation 601 (CCIR-601). The process of converting from a picture to the two interlaced fields of a frame is discussed in ANNEX C of the MPEG publication "Coding for Moving Pictures and Associated Audio for digital storage medium at 1.5 Mbit/s" incorporated by reference above.

Since the steps involved in compression and decompression, such as illustrated for the MPEG standard discussed above, are very computationally intensive, for such a compression scheme to be practical and widely accepted, the decompression processor must be designed to provide decompression in real time, and allow economical implementation using today's computer or integrated circuit technology.

SUMMARY OF THE INVENTION

In accordance with the present invention, a method and a structure are provided for decoding intraframe and interframe coded compressed video data. In one embodiment of the present invention, a decompression structure includes a processor, a decoder coprocessor, an inverse discrete cosine transform coprocessor and a motion compensation coprocessor, and a global bus for communication. The decompression structure in accordance with the present invention can also communicate with a host computer over a host bus and with an external dynamic random access memory (DRAM) over a memory bus.

The processor in the decompression structure of the present invention provides overall control to the decoder, IDCT and motion compensation coprocessors by reading and writing into a plurality of data and control registers each associated with one of the decoder, the IDCT and the motion compensation coprocessors.

In one embodiment of the present invention, the 2-dimensional display space is mapped into the linear address space of the external DRAM by embedding in the linear DRAM addresses X and Y vectors of the display space. Further, the mapping of the X and Y vectors in accordance with the present invention allows a macroblock of pixels to be stored in one DRAM memory page, so that access to a macroblock can be efficiently accomplished under page mode access to the DRAM page. In one embodiment, timing of the CAS signal is satisfied by delaying the falling edge of the clock signal. By looping the CAS signal back into the chip from an output pin, timing of data arrival from the external DRAM is better controlled. By providing special control to one address bit, data of four pixels can be obtained at one time in a 2×2-pixel ("quad pixel") configuration, or in a 4×1-pixel ("scan") configuration.

In one embodiment of the present invention, an HDTV decompression structure, including four of the decompression structures mentioned above, and a method are provided for decoding high definition television (HDTV) signals. In this HDTV decompression structure, each decompression structure decodes a 480×1088-pixel picture area with access to two 240×1088-pixel picture area. A method using a divide-by-15 divisor is provided in the HDTV decompression structure to map the display space into the external DRAM with efficient use of the DRAM physical address space.

In one embodiment of the present invention, a decoder logic unit, including a plurality of decode tables, and a method are provided in the decoder coprocessor to decode coded video data. Each coded datum to be decoded is provided to all of the decode tables. The decoded datum is selected by a finite-state machine from among the output data of all the decoded tables.

In one embodiment of the present invention, the processor of the decompression structure is provided with a structure and a method for minimizing the cost of computing a product by reducing the computation to a sum of modified operands obtained by using ternary arithmetic and either zeroing, negating or leaving unchanged precomputed constants.

In one embodiment of the current invention, a block memory structure and a method are provided for receiving 8×8-pixel blocks column by column in a 16×16-pixel picture area, such that the 16×16-pixel picture area can be output column by column simultaneously as the 8×8-pixel blocks are received, without double-buffering.

In one embodiment of the current invention, a motion compensation structure and a method are provided for interpolating interframe coded video data using motion vectors. The motion compensation structure comprises a filter for resampling the pixel data in both vertical and horizontal directions, a prediction memory structure and a weighted adder structure. In one embodiment of the present invention, a weighted adder structure and a method are provided for performing bilinear interpolation of two values using a plurality of multiplexers and an multiple-input adder.

In one embodiment of the present invention, a structure and a method are provided for accessing a 16×16-pixel picture area in two parts, in order that the number of DRAM page boundaries crossed during such access of the 16×16-pixel picture area is minimized, thereby increasing the efficiency of memory access by reducing the overhead cost associated with initial accesses of DRAMs under page access mode.

BRIEF DESCRIPTION OF THE DRAWINGS

FIG. 8b shows the byte addresses (lower 9 bits) of a 16×16-pixel macroblock.

FIG. 8c is a logic circuit which implements the control logic for bit E[6] in the byte address, so as to allow accessing memory in the quad pixel mode or in scan mode.

FIG. 9b-1 shows the display space under HDTV mode.

FIG. 9b-2 shows the linear physical address space for storing the video data of the display space shown in FIG. 9b-1, under HDTV mode.

FIG. 11a is a schematic diagram of a circuit 1200 for generating the control signals to multiply the Y-component of the motion vector and the screen width.

FIG. 12a–d shows the four patterns of memory access in bank0 of the block memory 314.

FIG. 12e shows the address bit patterns generated to access bank0 of block memory 314 in each of the four memory access patterns 0–3 of FIGS. 12a–d.

DETAILED DESCRIPTION OF THE PREFERRED EMBODIMENTS

Figure 2:
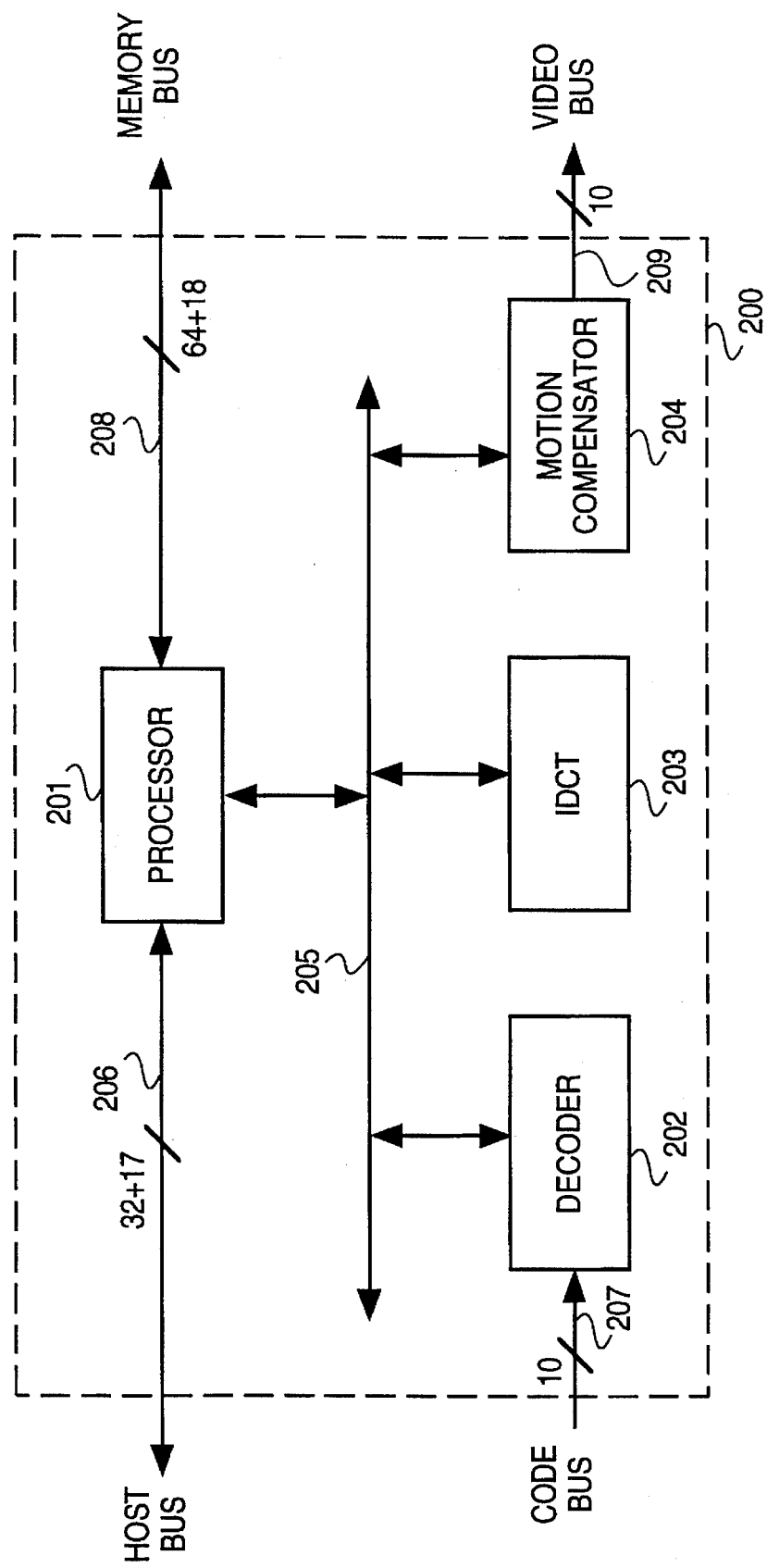
FIG. 2 is a block diagram of an embodiment of the present invention in a video decompression circuit 200.

FIG. 2 shows an embodiment of the present invention in a video decompression circuit 200. This embodiment of the present invention is provided in the CL950 MPEG Video Decompression Processor (the "CL950 chip"), available from C-Cube Microsystems, San Jose Calif.

As shown in FIG. 2, a video decompression circuit 200 has a processor 201, a decoder coprocessor 202, an IDCT coprocessor 203, and a motion compensation coprocessor 204 connected by a global bus 205. Video decompression circuit 200 has four interfaces: a 49-bit host bus 206, a 10-bit code bus 207, a 82-bit memory bus 208, and a 15-bit video bus 209.

The global bus 205 provides the conduit of communication amongst the processor 201, and the coprocessors 202–204. The global bus comprises a 32-bit data bus and a 7-bit address bus, with the least significant bit of the 7-bit address bus indicating whether the 7-bit address is a read address or a write address. Selected modules in the coprocessors 202–204 are each assigned four coprocessor addresses: a "read data" address (base address), a "write data" address (base+1 address), a "read control" address (base+2 address), and a "write control" address (base+3 address). In addition, processor 201 is assigned sixty four addresses to read and write thirty two registers in processor 201. As will be explained below, processor 201 monitors and controls the operations of the modules in coprocessors 202–204 by reading and writing into each module's control and data addresses.

The host bus 206 communicates with a conventional host computer using a standard communication protocol such as the ANSI/IEEE Standard 1196–1987 ("NuBus" Standard). The type of host computer and the communication protocol used are not consequential to the present invention. In this embodiment, the host bus 206 has a bidirectional 32-bit bus for data input and output purposes, an 8-bit address bus which includes "host request" (Hreq) and "read/write" (Hwrite) signals, 4 control input and output pins, a host clock, a global clock pin, a reset pin, an interrupt pin, and a test pin. Host bus 206 is a module given access to the global bus. The 7-bit address bus of the global bus 205 corresponds to the 7-bit address bus of the host bus 206.

The code bus 207 receives a 1-bit "code valid" (CVALID) signal indicating arrival of compressed video data ("code") in a byte stream CBUS[7:0] and provides a "ready" (CRDY) signal when code bus 207 is ready for the next byte of code.

The memory bus 208 connects up to three banks of dynamic random access memory (DRAM) external to circuit 200. Memory bus 208 has a bidirectional 64-bit data bus (208b) mdata[63:0] and an 11-bit address bus (208a) for multiplexing column and row addresses, consisting of bus maddr[9:1] and leads maddr0H and maddr0L. The mapping of the bits in the memory address bus 208a to row and the column addresses are discussed in a later section. Memory bus 208 can access the external DRAM under a fast page mode, which is discussed in further detail below. Three 1-bit "row address strobe" (RAS[1:0], RAS2) signals and a 1-bit "column address strobe" (CAS) signal are provided. The CAS signal is looped back as a "data ready" (MCASIN) signal. Because of clock skews and other factors, such as output loading, it is very difficult to control when the column address strobe signal actually arrives at the external DRAM, and hence when data are ready from the external DRAM. However, by looping back the CAS signal on the output pin, this embodiment can monitor the time at which the CAS signal is asserted at the external DRAM. Therefore, the uncertainty as to when the external DRAM receives the column address is removed, and hence the data arrival time, which is within a specified time from the assertion of the CAS signal, is known. Read or write operation is indicated by two bits of the write enable signal (MWE[1:0]).

The video bus 209 is a byte serial bus in CCIR-601 format operating synchronously with a video clock. The present embodiment supports both interlaced and non-interlaced applications. The video bus 209 has a 8-bit data bus (VBUS [7:0]). The VSYNC signal, which indicates the beginning of a frame, can be generated by video bus 209 as an output signal, or can be provided by the external display equipment as input signal to the video bus 209. A signal VPOP is provided to the video bus 209 when the external display equipment requests a byte of video data to be transferred in the next clock period. In addition, in this embodiment, five pins are reserved for future enhancement, such as for expanding the VBUS [7:0] bus to support direct output to an RGB type display.

Processor 201 is a 32-bit processor unit that provides overall control to the coprocessors 202–204, controls access to the external memory system, and generally handles exceptions and low frequency tasks.

Decoder 202 is a coprocessor which receives from code bus 206 a byte stream of variable length entropy-encoded codes. Decoder 202 performs decoding and dequantization of the entropy-encoded codes. The decoded code is provided to the IDCT unit 203 to be mapped from frequency space into the display space using an 8×8 2-dimensional inversed discrete cosine transform.

Motion compensation coprocessor 204 reconstructs P-pictures and B-pictures from motion vectors and past and/or future frames.

Figure 3:
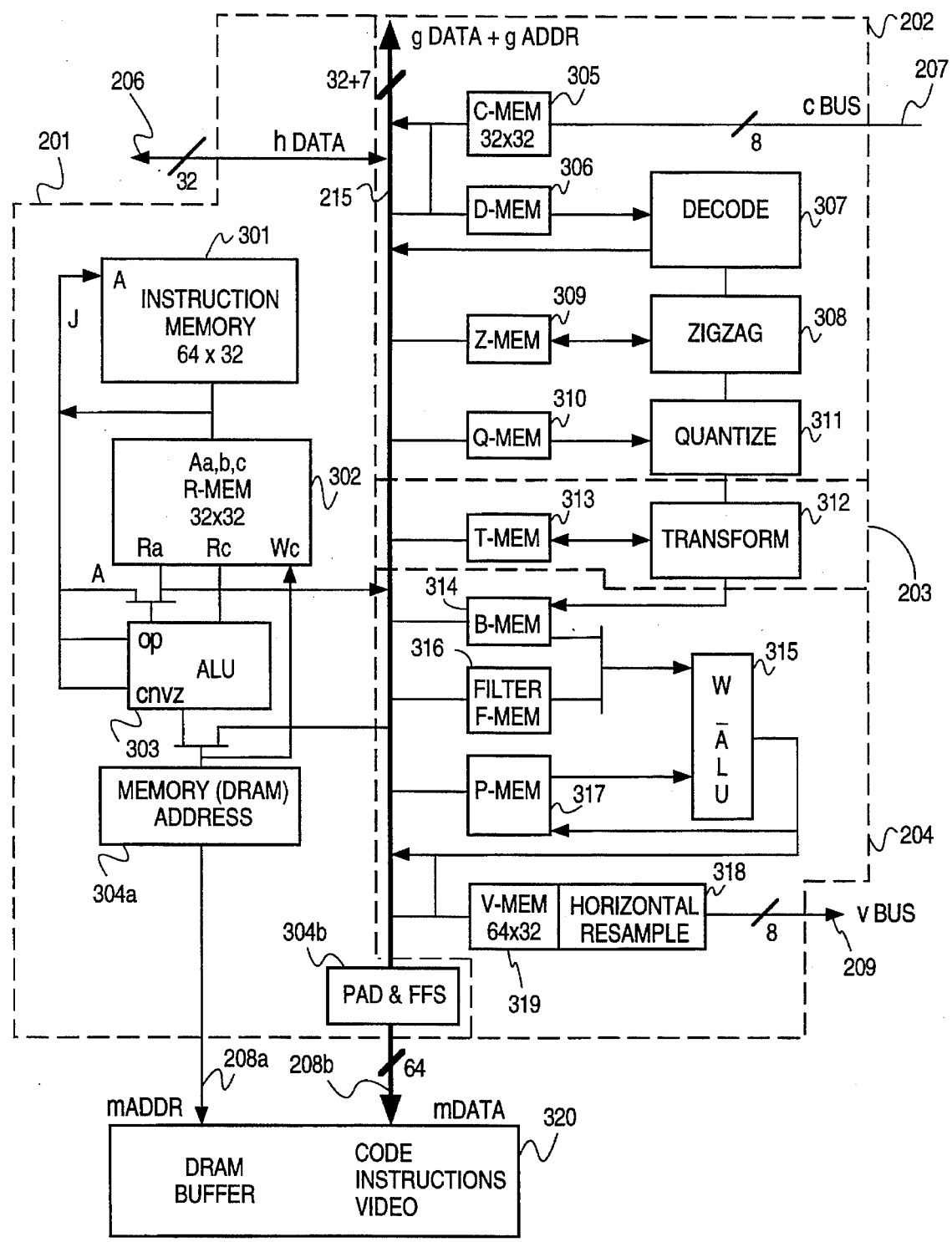
FIG. 3 is a more detailed block diagram of the video compression circuit 200 shown in FIG. 2.

FIG. 3 is a more detailed block diagram of FIG. 2's circuit 200, showing the functional blocks in processor 201, and coprocessors 202–204. As shown in FIG. 3, the processor 201 comprises a 64×32-bit instruction memory 301, a register file 302, which consists of 32 general-purpose 32-bit registers, an ALU 303, and a DRAM controller unit 304, which comprises both the DRAM address generation unit 304a and the "Pads and FF" or global bus interface unit 304b.

The decoder coprocessor 202 is shown in FIG. 3 to comprise a 32×32-bit code memory unit 305, a 32×32-bit decode memory unit 306, decode logic unit 307, zig-zag logic unit 308, 128×8-bit zig_zag memory 309, a 2×64×8-bit quantizer memory 310, and quantizer logic unit 311. The IDCT coprocessor 203 comprises a transform logic unit 312, and transform memory 313. The motion compensation unit 204 comprises a block memory unit 314, a pixel filter unit 316, a weighted adder/ALU unit 315, a pixel or prediction memory 317, consisting of a 128×16-bit and a 64×16-bit memory, a 64×32-bit video memory 319, and a horizontal resampler circuit 318.

PROCESSOR 201

As discussed above, the processor 201 controls the overall operation of circuit 200, including the operations of the coprocessors 202–204 and access to the external DRAM. The instructions of processor 201 have the general format shown in FIG. 4.

Figure 4:
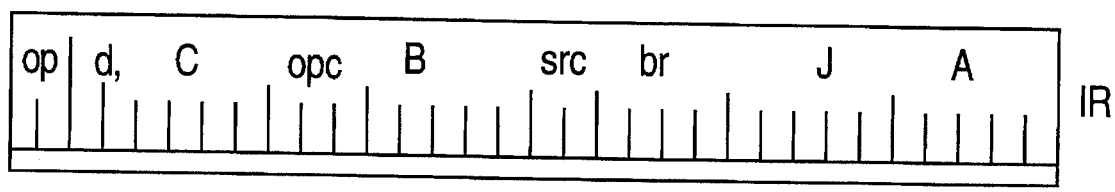
FIG. 4 is an instruction format of processor 201 in the video decompression circuit 200 of FIG. 2.

As shown in FIG. 4, the opcode field (combination of "op", "opc" fields) in an instruction of processor 201 consists of five bits, in which a 2-bit field "op" indicates the "major operation," which is either an arithmetic operation, a shift-operation, a load operation, or a store operation. A typical instruction specifies two sources "A" and "B" of operands and provides the result at a destination register "C". An instruction of processor 201 specifies in a 2-bit field "SRC" the "A" operand's source type, which can be either a register, a 5-bit immediate value, or a 14-bit immediate value. The "B" source of the instruction of processor 201 is always a 5-bit register, including a globally addressable register (see below), or a local register in register file 302. A bit "d" specifies whether the destination is a local register in register file 302, or a globally addressable register. The execution of an instruction in processor 201 sets a number of flags, which are tested by the next instruction to determine if a branch condition is satisfied. The condition to be tested is specified in a 4-bit branch control field "br". Upon a successful test of the branch condition, control is transferred to the instruction which address is contained in the register specified in the 5-bit jump target field "J". When the "A" source specifies a 14-bit immediate value, the "br", "J" and "A" fields are not available. Appendix E provides the instruction set of processor 201.

Prior to executing an instruction, the instruction must be loaded in the 64×32-bit instruction memory 301, which includes a 32-word instruction cache. The instruction cache holds one block of 32 instructions from the DRAM, and 32 always-resident instructions provided for cache management and for responding to the interrupts of the coprocessors 202–204 (see below). The instructions are fetched in a pipeline. To increase performance, the next sequential instruction and the instruction at the potential branch target are both fetched.

Thirty two general purpose registers are provided in register file 302. Register file 302 is provided with two read ports and one write port, to allow fetching of the two source operands and writing the result into the destination register, if required in the instruction format discussed above. Bypass multiplexers are provided for simultaneous read and write into the same register.

Each instruction of the processor 201 is executed in one clock cycle, excluding overhead or stall cycles. In memory load instructions, depending on whether a 32-bit or a 64-bit datum is loaded, an additional one or two cycles may be required before the destination register is updated. Because a special DRAM page access method is used (see below), successive accesses to DRAM locations in the same row can be initiated every other instruction. For the initial access to a new row, the access time can be four to six clock cycles. This period is hidden from the user by stalling the execution of the fourth instruction the requisite number of cycles. Hence, a load instruction latency of four instructions is maintained.

In certain time critical instructions, where there are no branch condition specified (i.e., the "branch never" condition), the field "J" (branch target address) is used to enhance performance by providing control signals to special circuits. These controls signals specify operations such as RAS precharge, video line access, memory refresh, and the special operations used in computing addresses of the motion compensated reference blocks. These special operations are discussed below in conjunction with the motion compensation coprocessor 204.

As discussed above, processor 201 controls the operations in each of the coprocessors 202–204 by writing into the control and data registers of modules in each of the coprocessor 202–204 over the global bus 205. The globally addressable registers are: the hCnt1 register in the host bus 205, the iCnt1 and iData registers in the processor 201, the cCnt1 register associated with code memory unit 305, the dCnt1 register associated with decode memory 306, the kCnt1, dData0, dData1, dDiag, dMV1 and dMV2 registers associated with decode logic 307, fCnt1 register associated with pixel filter unit 316, the sCnt1 and tCnt1 registers associated with IDCT unit 203, the zCt1 register associated with zigzag unit 308, bCnt1 register associated with block memory unit 314, the qCnt1 register associated with quantizer unit 311, the pCnt1 register associated with pixel memory 317, the vCnt1 register associated with Video memory 318, and the mCnt1 register associated with memory controller 304. A detailed description of the fields in each of these control registers are provided in Appendix B.

Under the control scheme of the current invention, each coprocessor, after initialization by processor 201, is controlled internally by a finite state machine. Processor 201 controls each of the coprocessors 202–204 is an independent process running in parallel other control processes. Four of these control processes are the code input, the decompression (both the code input and the decompression tasks are directed at decoder coprocessor 202), the motion compensation and the video output tasks (both motion compensation and video output are directed at the motion compensation coprocessor 204). These tasks are given priority to access the external DRAM in the order: a) video output, b) code input, c) decompression, and d) motion compensation. Some modules are initialized after reset, and some registers are updated after every frame. The filter control register in motion compensation coprocessor 204 is updated once every macroblock.

Figure 5:
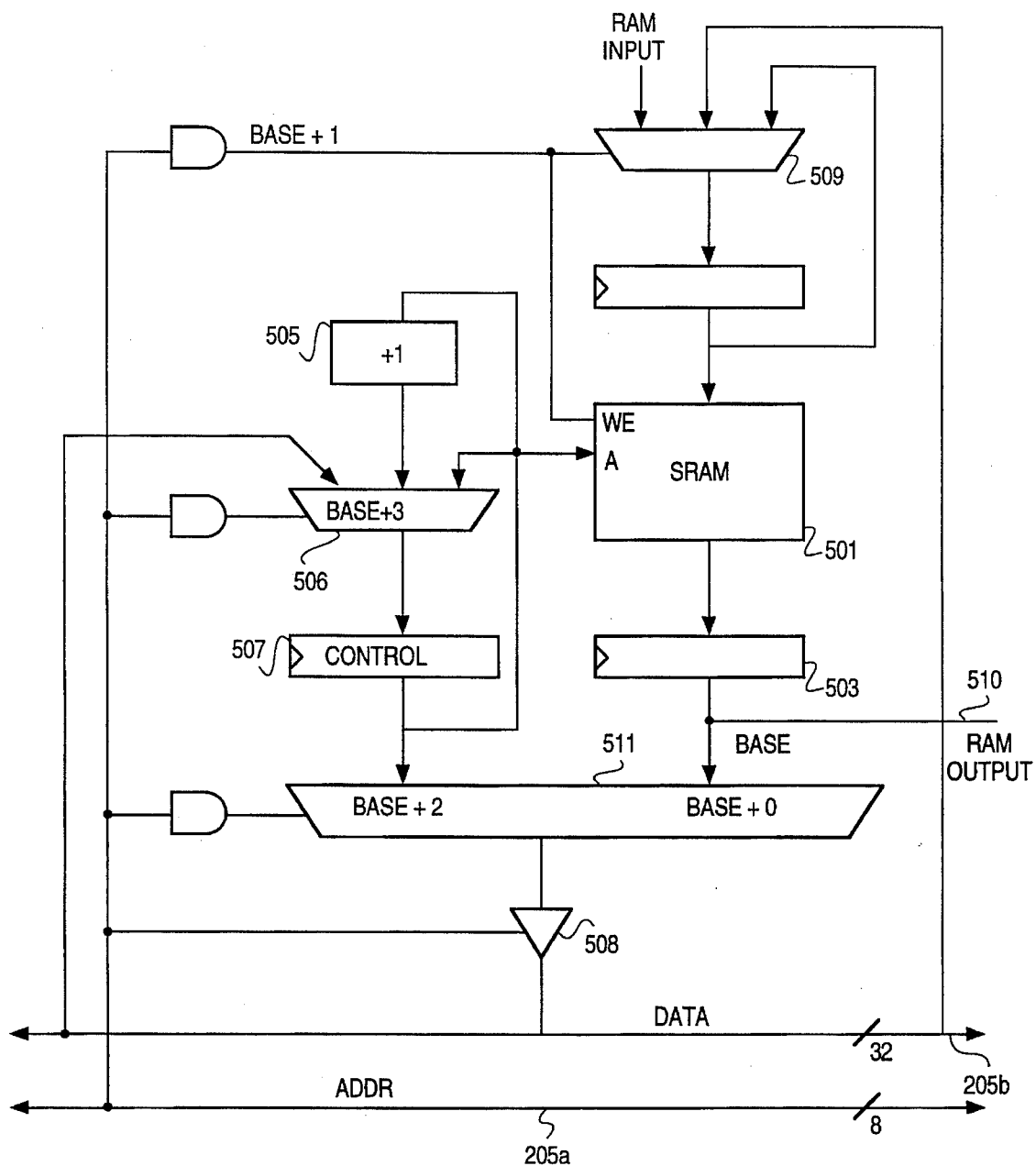
FIG. 5 illustrates movement of data in a coprocessor module having SRAM and a control register to and from external DRAM.

Processor 201 assists the host computers' or the modules' access to the external DRAM. For example, modules, such as decode memory 306 implements part of its first-in first-out memory (FIFO) in static random access memory (SRAM) on-chip, and overflows the FIFO into the external DRAM. The process of moving data into and out of the external DRAM is assisted by processor 201. FIG. 5 illustrates a scheme by which data in the external DRAM are loaded with the assistance of processor 201 into the SRAM 501 in a module having a control register 507. This scheme is illustrative generally of the manner in which processor 201 provides overall control for the coprocessors 202–204. As shown in FIG. 5, a module is assigned a base address, which is the "read data" address for reading data in a specified register in the module or at an SRAM location which address is specified in the control register 507 (placed by a previous "write control" access), a "write data" address (base+1) for writing into a specified data register or an SRAM location specified in the control register, a "write control" address (base+3) for writing into control register 507, and a "read control" address (base+2) for reading the control register 507. In this instance, the control register contains also a field for specifying an SRAM address. The data and control registers are readable and writable on the global bus 205, which comprises global address bus 205a and global data bus 205b. As an example of processor 201 assisting access to external DRAM memory by the module, when a predetermined level of "fullness" in the SRAM part of the FIFO is reached, an interrupt request by the module is sent to processor 201 by setting a bit in the module's control register 507. Processor 201 responds by clearing the module's "run flag" in control register 507. When responding to the interrupt, processor 201 reads and saves the current state of the module's control register. The amount of data to be transferred and the beginning address of the location in SRAM 501 from which data is to be transferred to the external DRAM are then written into control register 507. The memory controller 304 in processor 201 is set up for transferring data to the corresponding locations in the external DRAM. Data are read from SRAM 501 into data register 503, onto the global data bus 205, and then transferred into the external DRAM over memory bus 208 (64-bit wide). As each 32-bit datum is transferred, the data count in control register 507 is decremented and the SRAM address is correspondingly incremented by incrementor circuit 505 after every word transferred. Finally, when the data count reaches zero, processor 201 restores the state of the module's control register 507, with the run flag set.

Processor 201 also includes an arbitration unit (not shown) for allocation of the global bus 205. The global bus 205 can be allocated to one of four "clients": a) completion of load instruction (for storing data read from external DRAM into a destination register or SRAM location); b) the address stage of the instruction unit (for 64-bit "store double"), c) the host bus interface; and d) the execution phase of the instruction unit. Instruction execution is stalled for any host bus cycles and memory access conflict.

Processor 201 spends most of its time executing the task which controls decoding of a macroblock slice (i.e., a group of macroblocks, defined in the MPEG standard). The firmware "slice" which directs the decoding of the macroblock slice is included in Appendix D for reference. This macroblock slice firmware can fit at the same time in the instruction memory 301 with the interrupt firmware. In between the executions of the macroblock slice task, the macroblock slice firmware is swapped out to make room for execution of higher level routines, such as sequence initialization, picture initialization, error handling etc.

ALU 303 comprises input multiplexers, an input complementor, a 32-bit adder and logic unit, and a 32-bit barrel shifter. These circuits are generally known in the art and are therefore not repeated here.

DRAM Controller

DRAM Controller 304 supports both HDTV ("High Definition TV") and non-HDTV modes. Non-HDTV includes support for "enhanced definition TV" (EDTV). Under the non-HDTV mode, the memory controller 304 supports three banks of DRAM directly, providing the conventional DRAM control signals RAS (row address strobe), CAS (column address strobe) and WE (write enable). Under HDTV mode, the RAS signal is generated by an external circuit. DRAM controller 304 also provides refresh cycles. DRAM controller 304 comprises the functional units "dg_ms" (state machine), "dg_ma" (address block), "dg_mr" (refresh block) and "dg_mc" (control logic block). Models of these functional units are included in Appendix C for reference. These models are expressed in the VERILOG™ language for which commercially available circuit generators exist in the art to automatically generate circuit implementations from such models. VERILOG™ is a trademark of Cadence Design Systems, San Jose, Calif.

The external DRAM memory houses the rate buffer (also called the "code buffer"), reference frames and the current frame decoded. The code buffer is a FIFO ring that holds compressed data before decoding. An intracoded frame typically uses 3 to 17 times more data than predicted or interpolated frames. Therefore, if compressed data are arriving at a constant rate, the rate buffer accumulates data when predicted or interpolated frames are decoded, and depletes data when intra coded frames are decoded.

To implement the MPEG standard, the present embodiment holds two reference frames in the external DRAM. The DRAM may also hold all or part of the frame currently being decoded. If each macroblock can be output after it is processed, such as when an external frame buffer exists, then the current frame need not be stored. In another instance, when a line of pixel is displayed as soon as it is decoded, and displayed only once, then the DRAM need only hold two rows of macroblocks. However, up to a full frame of storage is required when the input code is not interlaced and the output signal is interlaced.

Non-HDTV Mode

The present embodiment supports 256K×16-bit, 256K× 4-bit or 64K×16-bit DRAM chips using different pin connections to the row and column address inputs of these chips. Table 1 shows the pin connections for these supported DRAM chips. Regardless of the particular chips used in the external DRAM, the external DRAM can be viewed as a byte-addressable memory having a 24-bit address space (E[23:0]). In the embodiment shown in FIG. 3, under non-HDTV mode, each memory word is 64-bit wide, allowing the memory to be organized as 256K×64-bit or 64K× 64-bit. In the 256K×64-bit configuration, bits E[22:21] select one of the three memory banks, and bits E[20:3] are provided as row and column addresses in accordance with the chips used in the implementation of the external DRAM (see Table 2). In the 64K×64-bit configuration, bits E[22:19] select the memory bank, and bits E[18:3] selects the row and column addresses.

TABLE 1

| maddr outputs | 9 | 8 | 7 | 6 | 5 | 4 | OL/OH | 3 | 2 | 1 |
|---|---|---|---|---|---|---|---|---|---|---|
| address bits output as column address | 10 | 11 | 10 | 9 | 8 | 7 | 6 | 5 | 4 | 3 |
| address bits output as row address | 11 | 20 | 19 | 18 | 17 | 16 | 15 | 14 | 13 | 12 |
| bits used for 256K×4 column address |   | C | C | C | C | C | C | C | C | C |
| bits used for 256K×4 row address |   | R | R | R | R | R | R | R | R | R |
| bits used for 256K×16 column address |   |   | C | C | C | C | C | C | C | C |
| bits used for 256K×16 row address |   |   | R | R | R | R | R | R | R | R |
| bits used for 64K×16 column address | C |   | C | C | C | C | C | C | C | C |
| bits used for 64K×16 row address | R |   | R | R | R | R | R | R | R | R |

Figure 6:
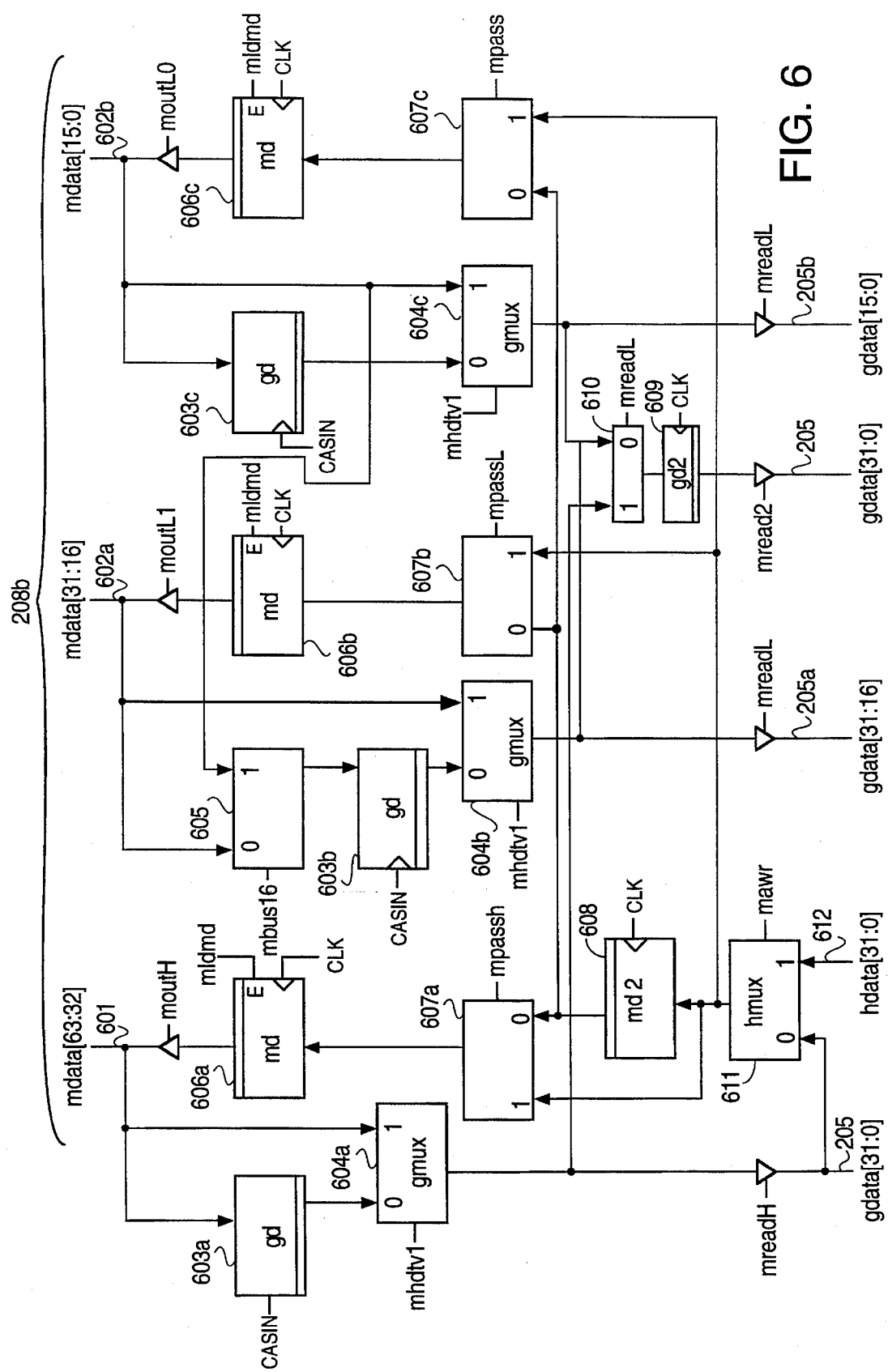
FIG. 6 shows the interface between the global bus 205 and the memory data bus 208b in the memory controller 304 of FIG. 3.

FIG. 6 is a schematic diagram of the global bus and memory bus interface unit 304b of the present embodiment. As shown in FIG. 6, the memory data bus 208b comprises two 32-bit busses mdata[63:32] (bus 601) and mdata[31:0] (bus 602, comprising busses 602a and 602b), respectively referred to as the "higher" and the "lower" 32-bit busses. The lower 32-bit bus can be further divided into two 16-bit busses for 16-bit operations. Registers 603a, 603b and 603c latch the 64-bit data from the external DRAM on bus 208b (busses 601 and 602) for loading onto the 32-bit global bus 205. In the other direction of data flow, registers 606a, 606b and 606c latch the 32-bit data from the global bus 205 to the 64-bit memory data bus 208b.

Because 64-bit data arrive from the global bus 205 over two clock periods, the first (higher) 32 bits are temporarily stored in register 608. These 32 bits are then written at the same time with the lower 32 bits into respectively the registers 606a, 606b and 606c for simultaneous output on memory bus 208b. Multiplexers 607a, 607 b and 607c can be used to bypass register 608 and to channel a 32-bit datum from the host data bus 612 (through multiplexor 611) to either the high 32-bit or the low 32-bit of the memory data bus 208b. Since each datum from the external DRAM on bus 208b is 64-bit wide and the global bus 205 is 32-bit wide, the 64-bit datum is first loaded into the registers 603a, 603b and 603c, when the "data ready" signal MCASIN is received. The higher 32-bit datum in register 603a is sent to the global bus 205, while the 32-bit datum in registers 603b and 603c is temporarily stored in register 609 for output to global bus 205 in the next clock period. Storing the lower 32-bit datum in register 609 instead of letting it remain in registers 603b and 603c is necessary to avoid it being overwritten by the next datum arriving on busses 602a and 602b in the next clock period, in the event when the signal MCASIN is received during the same clock period as the corresponding "column address strobe" signal (MCAS) is sent, when operating in burst mode during which memory read requests are sent every other clock period.

Figure 7A:
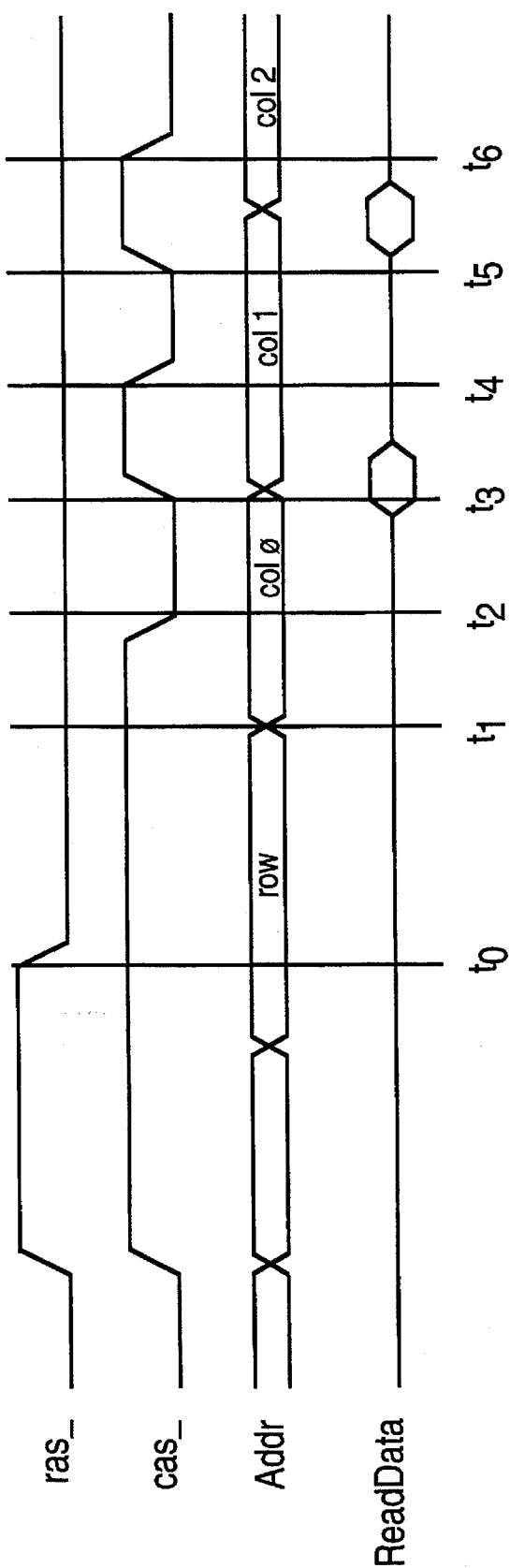
FIG. 7a shows the control and data signals of a page mode access to a conventional dynamic random access memory.

In order to initiate a memory request every other clock period, page access mode is used. FIG. 7a shows the data and control signals for the conventional page access mode. As shown in FIG. 7a, the RAS signal goes to logic low state at time t0, indicating that row address is ready. The CAS signal then goes to logic low state at time t2 indicating the column strobe address is ready. The initial read access is completed at time t3 when the data read (represented by the signal "ReadData") arrive from the DRAM. Under page mode, the second read after the initial access can begin at time t3 by bringing CAS high again and providing only the column address, while the RAS signal remains low. Thereafter, the second read access is completed at time t5, when the second datum arrives from the DRAM. The third read access can likewise be initiated by bring CAS to logic high state again at time t5.

Since most commercially available DRAM components require unequal hold times of "CAS low" and "CAS high" (e.g., for some 80 ns DRAMs with minimum page mode cycles of 55 ns, the minimum hold times for CAS low and CAS high are respectively 10 ns and 30 ns), a convenient timing scheme for implementing the page mode access of FIG. 7a is by synchronizing the rising and falling edges of the CAS signal with the global clock, so that, in the first clock period, the CAS signal is high during the time when the global clock is high, and changing state to CAS low when the clock changes to low state. In the next clock period, CAS remains low. For a 45–55 duty cycle clock, this timing scheme requires that 1.55 clock periods must be long enough to satisfy the CAS low hold time requirement, and 0.45 clock period must be long enough to satisfy the CAS high time requirement. Under this scheme, for CAS high hold time, the margin allowed for timing variation due to fluctuations in the manufacturing process is very small. For example, if the timing scheme described above is used in the present embodiment, which has a 45–55 duty cycle global clock of 36 MHz (27.8 ns per clock period), the CAS high time for the 80 ns DRAM above is not met. This is because the global clock has a logic high period for only 12.5 ns, and the transition times for the CAS signal can be greater than 2.5 ns, leaving less than 10 ns to satisfy the CAS high hold time requirement. One solution will be to extend the global clock period in order to meet the CAS high hold time requirement. This method is very wasteful.

Figure 7B:
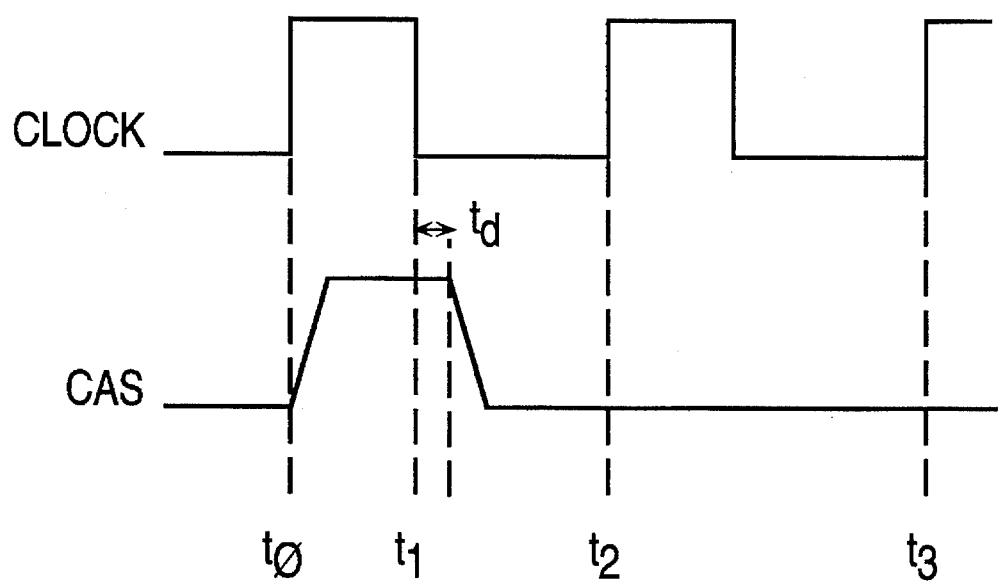
FIG. 7b shows the delayed CAS falling edge to meet CAS high requirement, in accordance with the present invention.
Figure 7C:
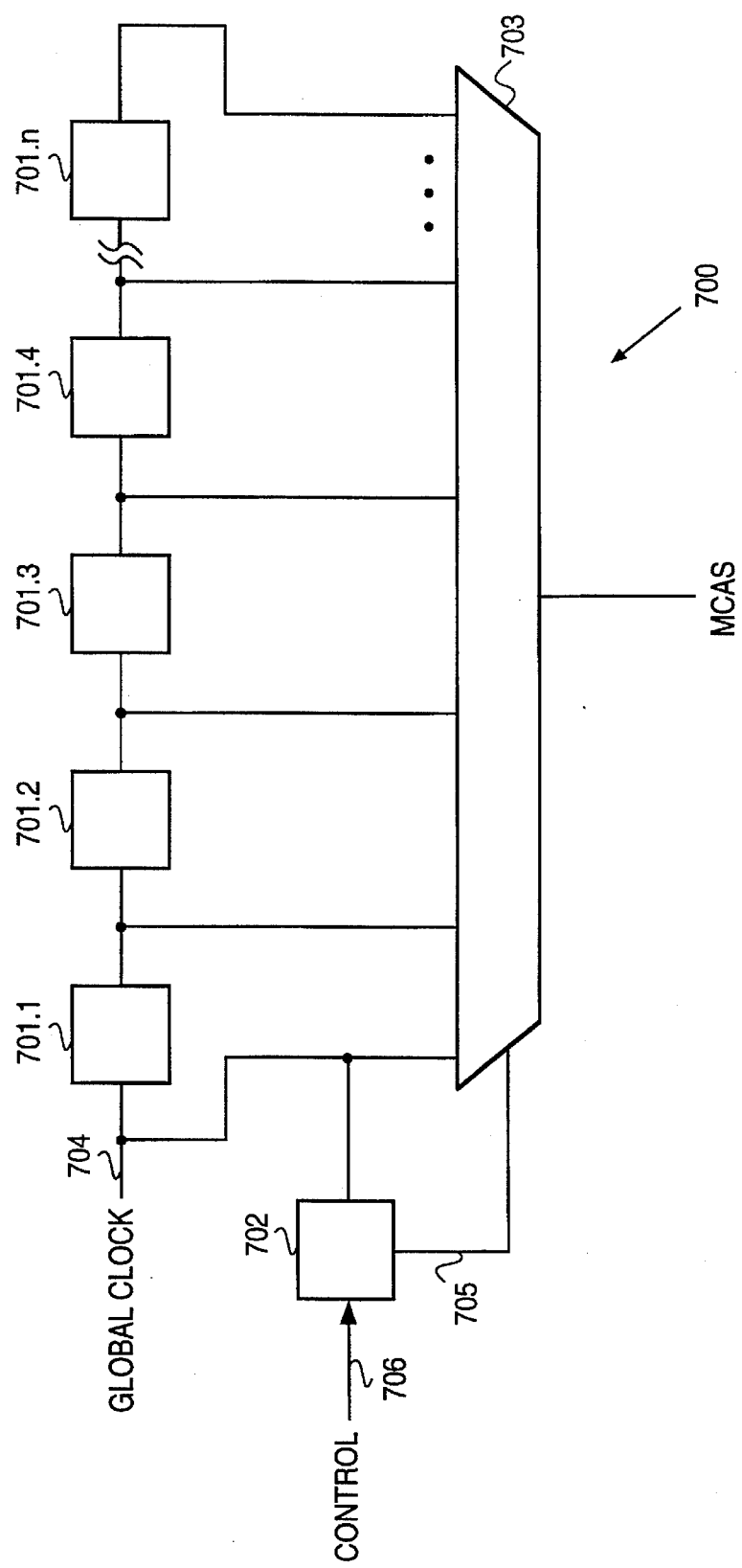
FIG. 7c is a schematic diagram of a circuit 700 to implement the delayed CAS signal in accordance with the present invention.

Noting that there is a margin in the CAS low time (e.g. in the 80 ns DRAM discussed above, the minimum CAS high time is 30 ns, and 1.55 clock period is 40.3 ns), the above CAS high hold time problem can be overcome by delaying the high to low transition of the CAS signal without requiring a longer global clock period. FIG. 7b shows the CAS signal being delayed by a time period td after the global clock assumes a logic low state at t1 in the first clock period (between t0 and t2). The delayed CAS signal can be generated by the circuit 700 shown in FIG. 7c. In FIG. 7c, the global clock signal is provided on lead 704, which is fed into a number of serially connected delay elements 701.1 to 701.n. Edge detector 702 detects, when the global clock transitions, whether the transition is a logic high to logic low or a logic low to logic high transition. When the edge detector 702 detects a logic low to logic high transition, a control signal is sent over lead(s) 705 to set multiplexer 703 to select the clock signal; otherwise, the control signal on lead(s) 705 sets multiplexer 703 to select one of the delayed output signals of delay elements 701.1 to 701.n. The control signal in lead 705 select the amount of delay according to a user parameter. The CAS signal is held to logic low during the next clock period. While other circuit elements can be used, in the present implementation, each delay element is a 3-input NOR gate.

Figure 8A:
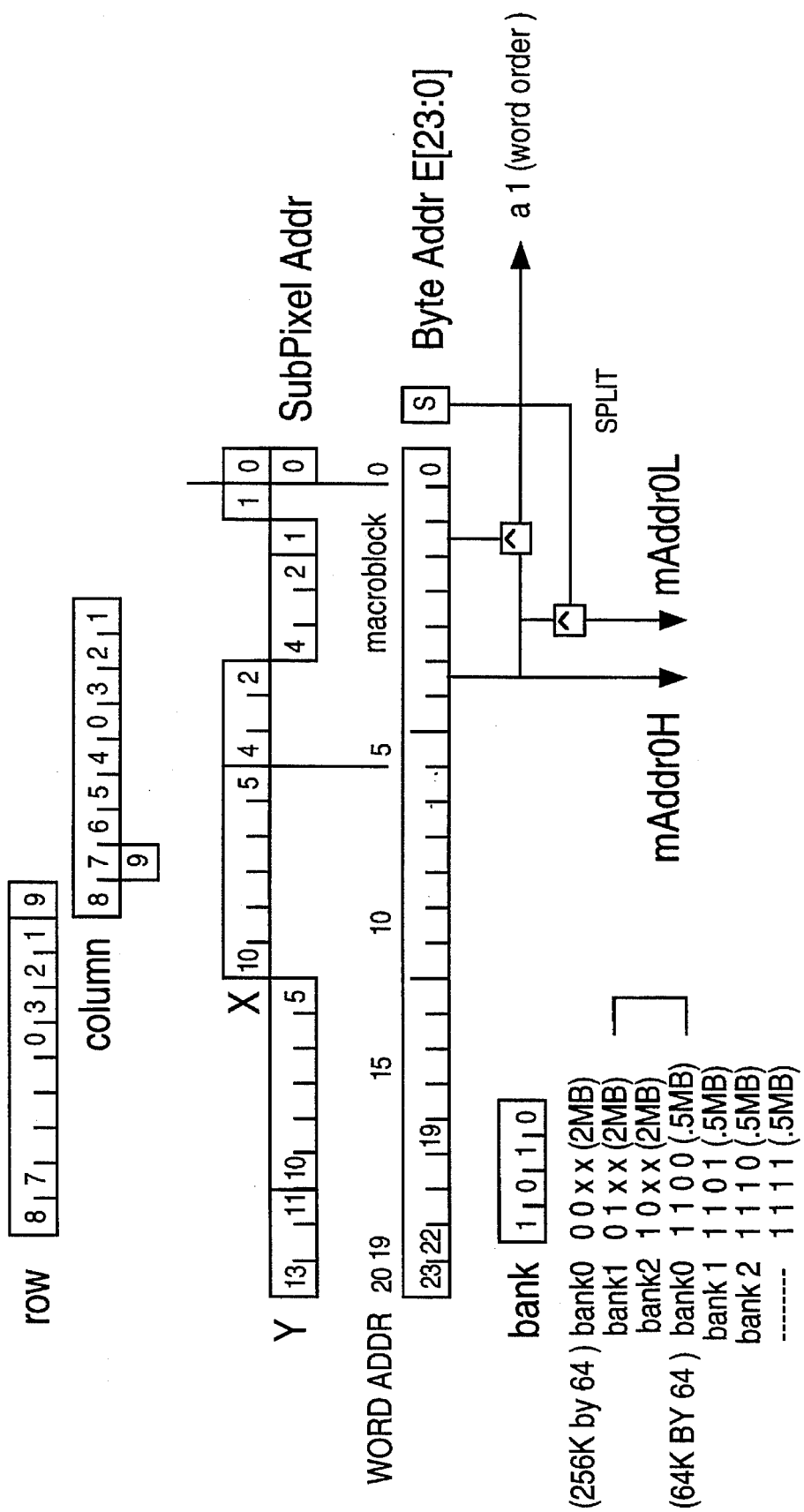
FIG. 8a, show the mapping of the 2-dimensional display space to the 24-bit linear address space of the external DRAM.

The 2-dimensional space of a display is mapped into the 24-bit linear address space. One such mapping from screen space to the DRAM address space is shown in FIG. 8a. Since luminance and chrominance data of two pixels adjacent each other in the vertical direction can be represented in 32 bits (YYUV) for both the 4:2:2 and the 4:2:0 formats, two pixels can be stored in a 32-bit half-word in the present embodiment. In the present embodiment, the 24-bit address space is used to represent a 2-dimensional screen space of $2^{10}$ (X) by $2^{13}$ (Y)-pixel picture area. FIG. 8a shows a mapping of the 2-dimensional screen space to the byte address space E[23:0] of the DRAM. As shown in FIG. 8a, the Y vector Y[13:0] can be represented by E[23:15,5:2,0] and the X vector X[10:0] can be represented by E[14:6,1,0]. Bit E[0] can be used to represent sub-pixel space, if necessary. This representation allows the bits E[8:1] to represent the a 2-dimensional space inside the macroblock, with bits E[8:6,1] and bits E[5:2] as the x and y vectors respectively. In this macroblock space, the address (E[8:6], E[5:3]) specifies one of the 64 quad pels, with bits (E[1], E[2]) specifying one of the four pixels in the quad pel.

In this embodiment, the address generation unit 304a of the memory controller 304 receives from processor 201 the byte address E[23:0]. As shown in Table 1 above, the bits of the memory address bus 208b (maddr[9:1], maddr0H, maddr0L) are given by (E[11], E[20:16], E[14:12], E[15], E[15]) for providing the row address, and (E[10], E[11:7], E[6:3], E[6], E[6]) for providing the column address. The pixels are stored in the DRAM at byte addresses shown in FIG. 8b. When a "load double" (LDDA) instruction is executed, four pixels in a 64-bit word are fetched from the DRAM memory. In the present embodiment, two modes of pixel access are allowed. Depending on whether "quad pixel" or "scan" mode is selected, these four pixels correspond either to a quad pixel (2×2), or four pixels in the same horizontal scan line ("scan order"). To allow such access, quad pixels must be stored into the DRAM over the memory data bus 208b in accordance with the following rule:

| address(E[6:3]) | mdata[63:32] | mdata[31:0] |
|---|---|---|
| 0XXX | UT VT YT YT | UB VB YB YB |
| 1XXX | UB VB YB YB | UT VT YT YT | where "T" denotes data corresponding to the top two pixels of the quad pixel, and "B" denote that the data corresponding to the bottom two pixels of the quad pixel. Storing top and bottom pixels alternately according to the parity of bit E[6] (i.e., changing the top and bottom pixel store order every 8 column addresses) allows fetching either four top or four bottom pixels (i.e., four pixels on the same horizontal line) simultaneously. This ability to fetch pixels in scan order is efficient in providing pixels to the video memory 318 for output. On the other hand, the ability to fetch pixel in quad pixel order facilitates the resampling step in motion compensation (see below).

To fetch a quad pixel, the maddr0H and maddr0L are each given the value of E[6], so that the word address (i.e., E[23:3]) of the higher 32-bit halfword fetched in mdata [63:31] is the same as the word address of the lower 32-bit halfword of fetched in mdata[31:0]. However, when fetching in the scan mode, the following rule is followed when providing the word column address to the external DRAM:

|  | maddr0H | maddr0L |
|---|---|---|
| even scans (i.e., E[6]=0) | 0 | 1 |
| odd scans (i.e., E[6]=1) | 1 | 0 |

Recalling that the column word address for the higher 32-bit halfword fetched by mdata[63:32] is specified by (maddr[9:4], maddr0H, maddr[3:1]) and the column word address for the lower 32-bit halfword fetched in mdata[31:0] is specified by (maddr[9:4], maddr0L, maddr[3:1]), the column word addresses of the higher 32-bit and lower 32-bit of mdata[63:0] are offset by 8 column word addresses under scan mode access. Because there are eight quad pixels in each column, the pixels fetched under scan mode are in adjacent quad pixels. Since the pixels are stored accordance to parity of E[6], as specified above, the pixels fetched are either both the top pixels of each quad pixel, or both bottom pixels of each quad pixel.

In this embodiment, a separate logic circuit is provided to decode bit E[6] of the DRAM address. One implementation is provided in FIG. 8d. In FIG. 8d, the signal "scan" is at logic high for scan mode and at logic low for quad pixel mode, and the signal "word order" indicates in quad pixel mode whether the top pixels are found in the higher 32-bit halfword (word order=0) or the lower 32-bit halfword (word order=1) of the memory data bus mdata[63:0].

HDTV Mode

Figure 9A:
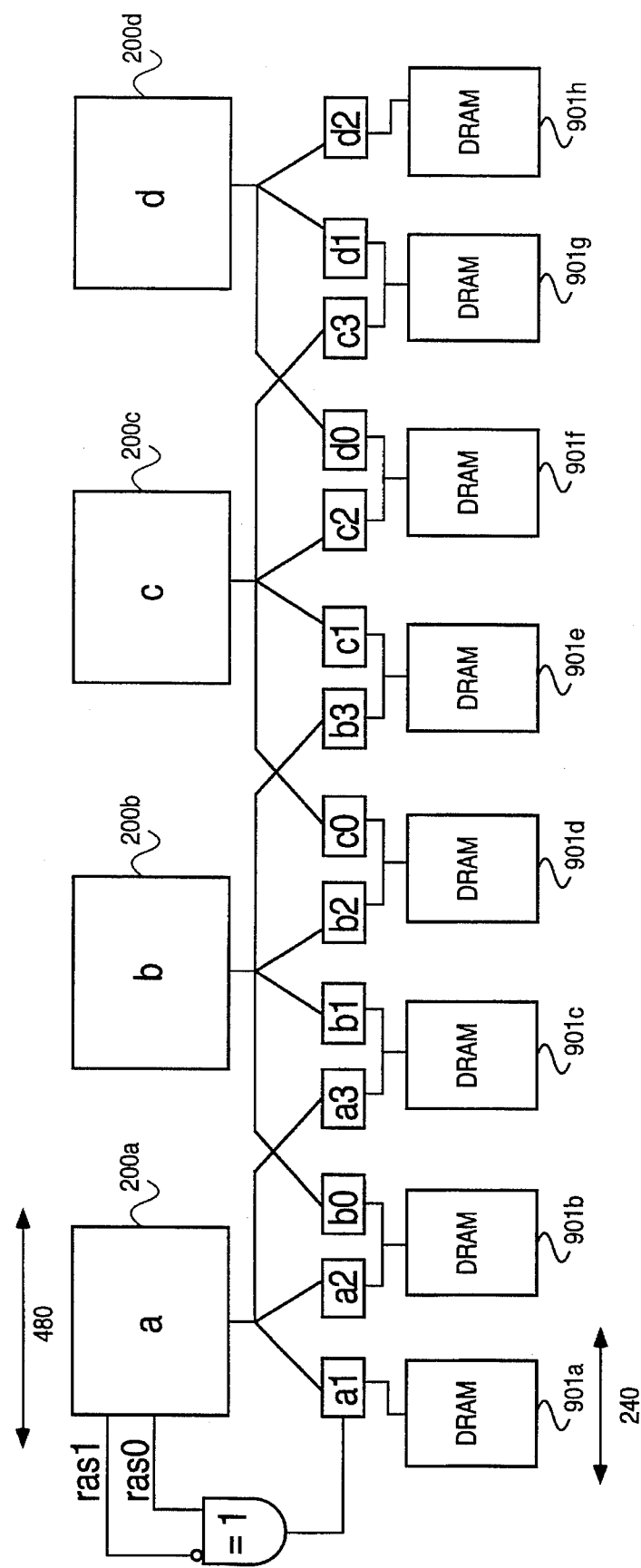
FIG. 9a shows the display space seen by one of four video decompression circuits under HDTV mode in accordance with the present invention.

HDTV applications are supported in accordance with the present invention by configuring, as shown in FIG. 9a, four of the video decompression circuit 200 of FIG. 2. In FIG. 9a, four of the video compression circuit 200, 200a–200d, are provided with eight memory banks 901a–901h. Video compression circuits 200a–200d each communicate with two banks of memory, in addition to one memory bank from each of its left and right neighbors, if any. In HDTV, the display space is 1920×1080 pixels.

Figure 1:
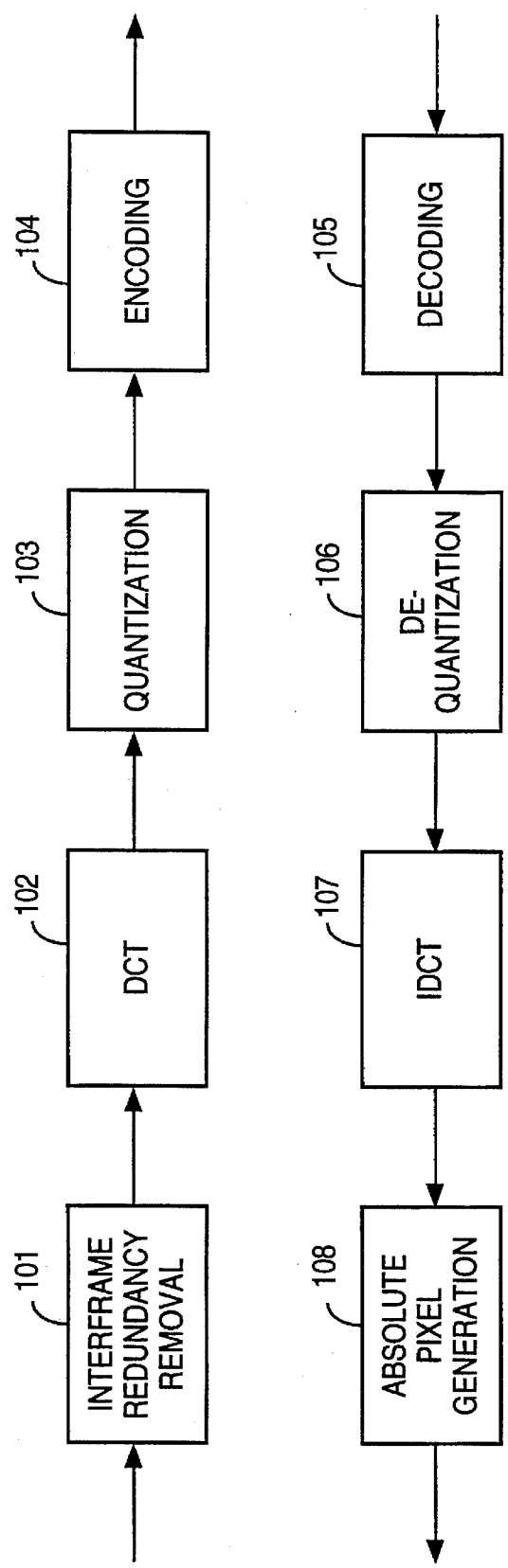
FIG. 1 is a model of the compression and decompression processes under the MPEG standard.
Figures 1, 9B:
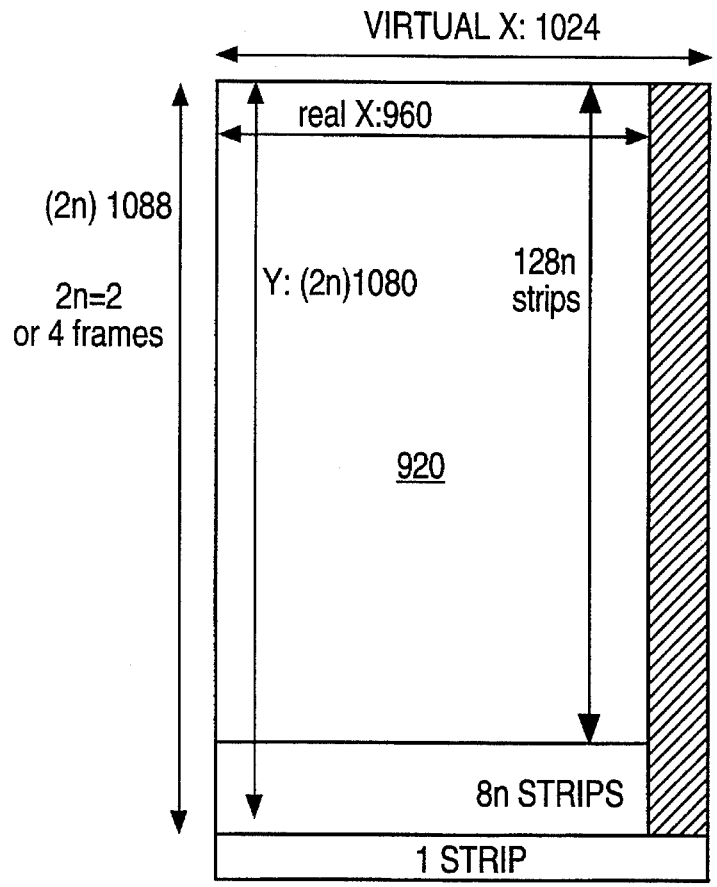
Figures 2, 9B:
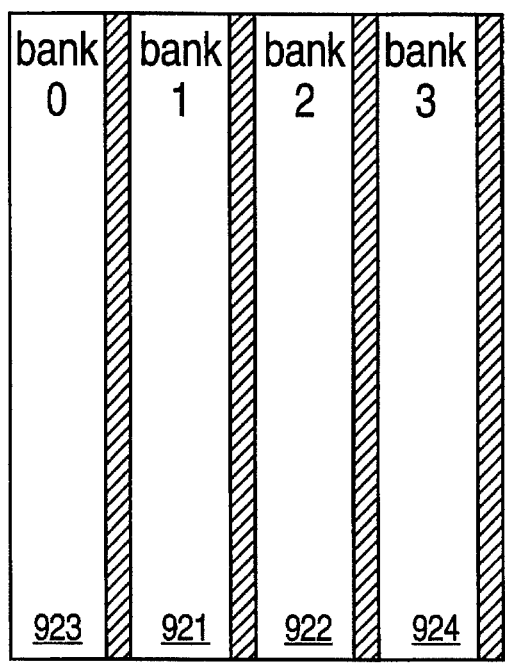

In the present embodiment, the HDTV display space is divided into four vertical sections of 480 by 1080 pixels, with each section contained in two banks of memory. FIG. 9b-1 shows the display space 920 for one of the four video decompression circuit 200a–d. As shown in FIGS. 9b-1 and 9b-2, the display space seen by each of the four video decompression circuits 200a–d is a display area of 960× 1080 pixels, in which the middle 480×960-pixel picture area is stored in the video decompression circuit's own memory banks 921 and 922, and the two 240×480-pixel picture areas on each side of the middle 480 by×1080-pixel picture area are stored in the memory banks 923 and 924 of its neighbors to the left and to the right respectively. Video compression circuits 200a and 200d (FIG. 9a) each have a 240×1080-pixel picture area not mapped to the display space, since video compression circuit 200a and 200d each have only one neighbor. Access to a neighbor's memory bank is necessary only when motion compensation requires access across the boundaries of the vertical sections. Because motion vectors are of limited range, the problem arising from the same bank of memory being accessed by more than one video compression circuit can be avoided by requiring that the video decompression circuits 200a–d decode the vertical sections in lock-step. Such synchronization can be provided by tying the VSYNC pin of the video decompression circuits 200a–d together.

Figure 9C:
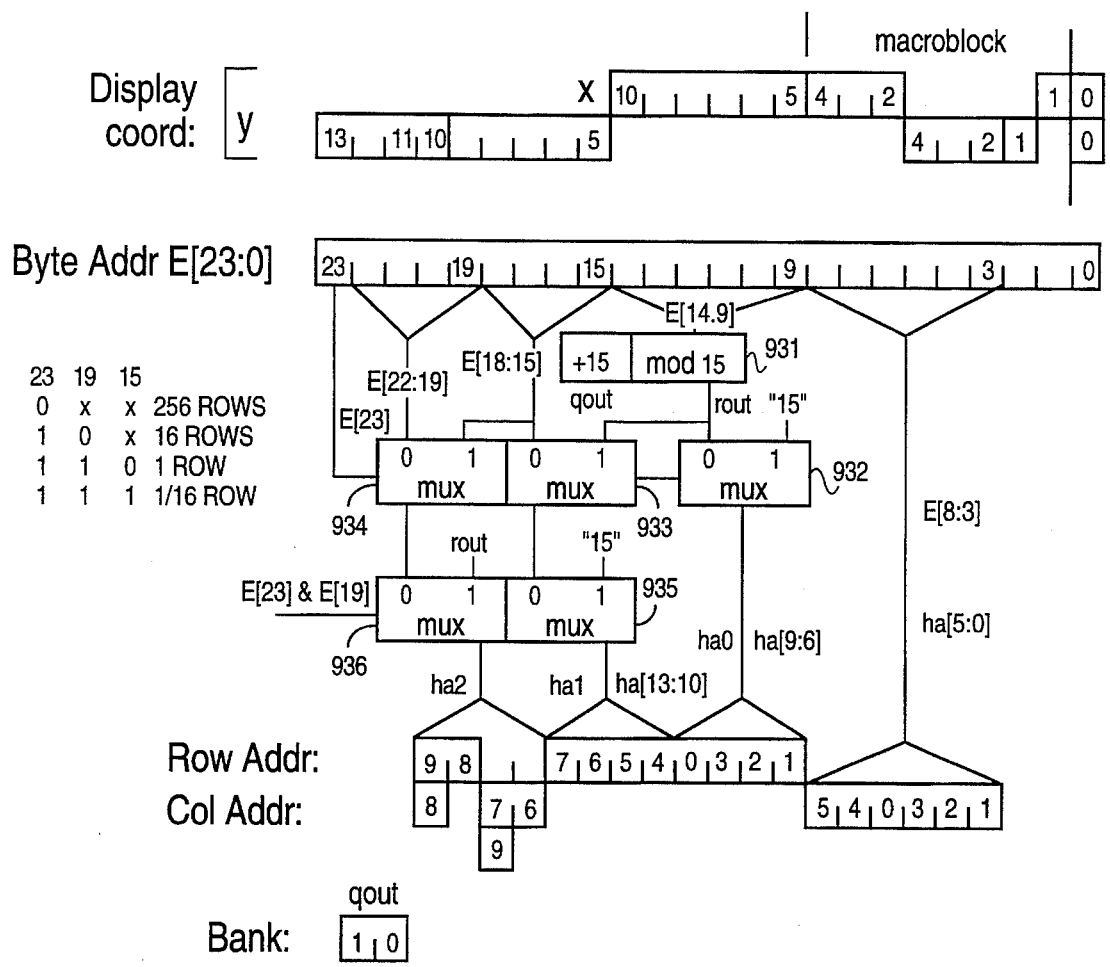
FIG. 9c is a functional block diagram of a circuit which implements the mapping of DRAM byte address to the linear physical address space.
Figure 9D:
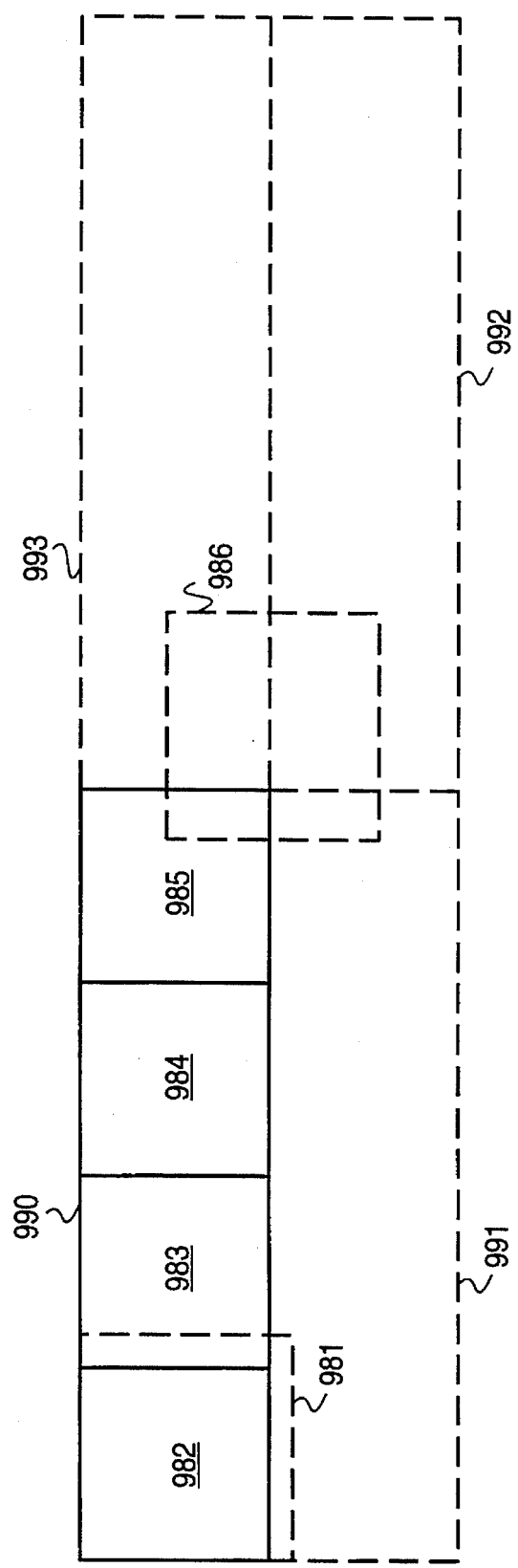
FIG. 9d shows that the operation of fetching reference macroblocks 981 and 986 requires crossing one and four DRAM page boundaries respectively.

Further, since a reference macroblock needs to fetch an 18×18-pixel picture area, and four 8×9-quad pixel macroblocks are typically stored in one page of DRAM memory, dependent upon the position of the reference macroblock, a macroblock fetch can cross 1–4 DRAM paper boundaries. FIG. 9d illustrates the number of DRAM page boundary crossings for two reference blocks 981 and 986. In FIG. 9d, the reference macroblock 981 spans two DRAM pages 990 and 991. DRAM page 990 stores four 8×8-quad pixel picture areas 982–985. Fetching this reference block 981 requires crossing the DRAM page boundary between DRAM pages 990 and 991. However, reference block 986 spans four DRAM pages 990, 991, 992 and 993 requiring four crossings of DRAM page boundaries to complete a fetch operation of the entire reference macroblock 986. Therefore, in accordance with the present invention, in order to maintain the lock-step relationship amongst each video decompression circuits 200a–200d, each page mode access is limited to fetching only an 8×8 quad pixel picture area, so that regardless of the number of DRAM page boundaries required to be crossed, four page mode access cycles are required for each reference block fetched. In this manner, since the number of pixels processed by each video decompression circuit 200a–d are the same, the lock-step relationship is always maintained.

Under the HDTV mode, the mapping of DRAM byte addresses onto the linear physical address space is different from the mapping under non-HDTV mode described above. Since the size of the each vertical section is not a power of 2 in the x-dimension and each section is separately processed by up to three video compression circuits, a straightforward mapping of byte address space to the linear physical address space, such as that used in the non-HDTV mode (physical addresses obtained by rearranging the bit pattern of the DRAM byte address E[23:0]), will lead to inefficiency. For example, such allocation of the display space leads to video compression circuits 200a–c each processing a picture area of 256 pixels×1080 pixels, and video compression circuit 200d processing a 192×1080-pixel picture area. Coupled with the requirement that video decompression circuits 200a–d decode in lockstep, the speed of decompression under HDTV mode will be degraded because the uneven distribution of load leads to frequent wait cycles. Therefore, a mapping is desired such that the load on each video compression circuit 200, and hence its associated memory banks also, are balanced.

In accordance with the present invention, a mapping scheme from the DRAM byte address space to the physical address space is adopted which equally divides the display space among the video decompression circuit 200a–d. In addition, the mapping leaves very few locations in the linear physical address space which do not correspond to a pixel in the display space. The present invention minimizes such gaps in the linear physical address space with some added complexity. Nevertheless, eliminating the waste due to having memory locations never accessed is desirable. FIG. 9c shows in block diagram form this mapping of the DRAM byte address space E[23:0] to the physical memory address space.

Under the scheme of the present invention, bits E[23:3] of the DRAM byte address E[23:0] are mapped into the row and column addresses of the linear physical address space. The display address space (X, Y vectors) are also provided in FIG. 9c for reference. The linear physical address space is assumed to be specified by the bank b[1:0], row[9:0] and column col[9:0] addresses. As in the non-HDTV mode, dependent upon the type of DRAM type chosen, not all of these bits are connected. Bits E[8:3], which correspond to the addresses of quad pixels within a macroblock, are provided directly to the column address bits Col[5:0]. Bits E[14:9], which specify the macroblock in the "strip" specified by the x vector (a "strip" is a one macroblock-high picture area spanning the horizontal extent of the display space), are mapped into one of the 60 macroblocks in the four memory banks accessible by the video decompression circuit. This mapping is performed by a divider represented by block 931, dividing the value of E[14:9] by 15, so that the remainder via a multiplexer 932 is provided as the row address bits row[3:0], and the quotient is provided as the bank address bits b[1:0]. This method allows the elements of the macroblock to be stored at the same row address in the same memory bank, thereby allowing page mode access to the elements of the macroblock. Also, the division result only affects the row and bank portions of the DRAM address and does not affect the column address. As a result, the extra computation time required to perform the division is not critical to affect fast page mode access.

Since the division scheme above generates a remainder between 0 and 14 inclusive, a value of 15 ('FH) in bits row[3:0] cannot be generated, and so leaving a gap in the physical address space. In accordance with the present invention, such gaps are filled by mapping into them the macroblock strips corresponding to higher Y vectors. In the 1024 lines (Y<=1024) counting from the top of the display space, the value of the bit E[23] is zero, the bits E[22:15] are respectively provided via multiplexers 933–936 as the value in bits (row[9:8], col[7:6], row[7:4]). However, if the bit E[23] equals 1 and E[19]=0, corresponding to a Y vector between 1024 and 1088, a value 15 is forced by multiplexer 932 into row[4:0] and the remainder rout provided by divider 931 is provided by multiplexers 933 and 935 as row address row[7:4], and bits E[18:15] are provided via multiplexers 934 and 936 respectively as the bits (row[9:8], col[7:6]). Hence, the bits E[22:19] are now mapped into the gap represented by value 15 in row[3:0] of the physical address space.

This approach is taken one step further when bits E[23] and E[19] are both 1. In that situation, values of 15 are forced by multiplexers 932 and 935 into both row address bits row[7:4] and row[3:0], and the value of DRAM byte address bits E[18:15] is provided via multiplexers 934 and 936 respectively to the bits (row[9:8] and col[7:6]), mapping these DRAM byte addresses into the gap corresponding to a value 'FFH in row[7:0] of the physical address.

Figure 9E:
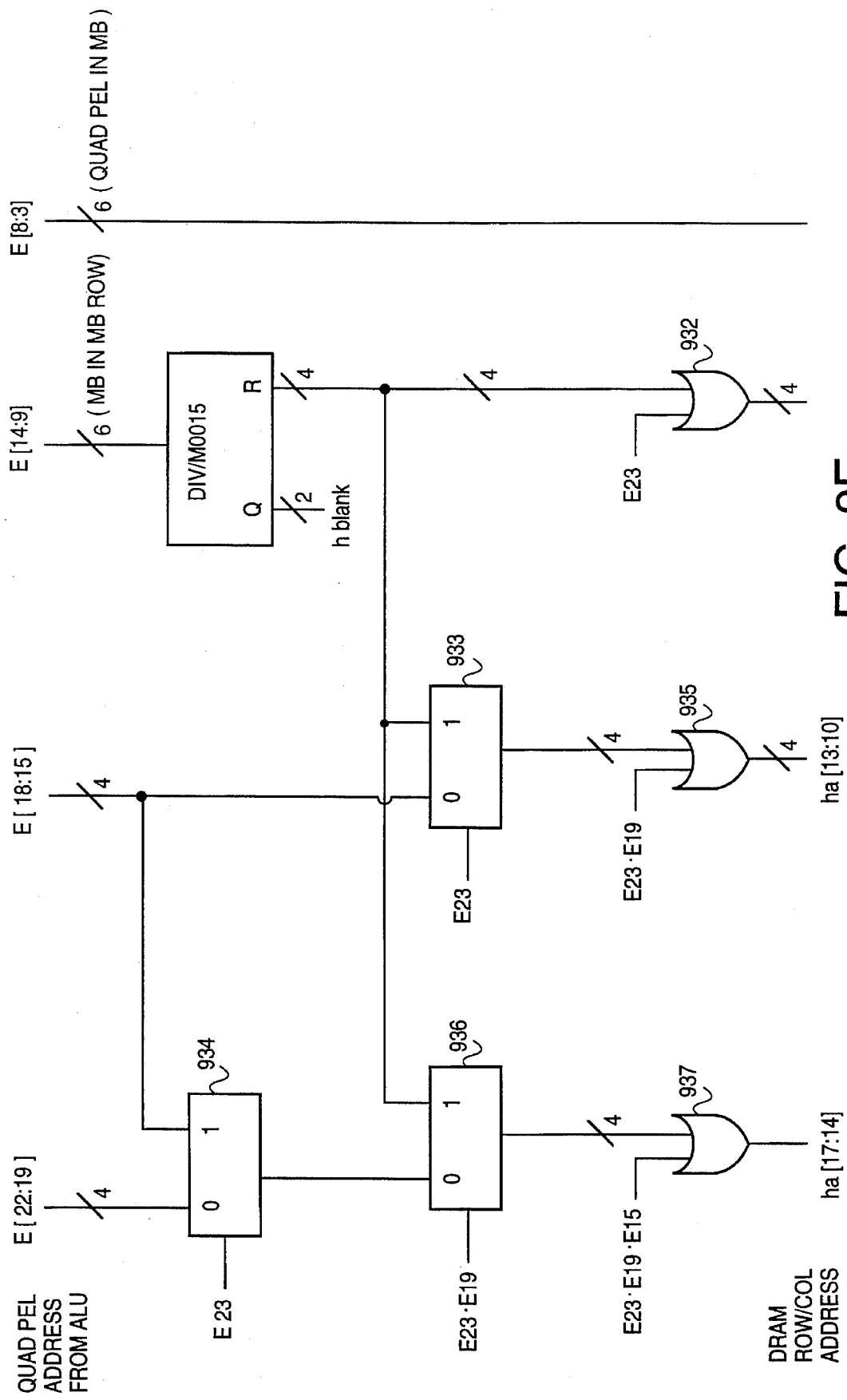
FIG. 9e shows a circuit implementation of the mapping scheme shown in FIG. 9c.

FIG. 9e is a circuit for implementing the mapping mechanism described above in conjunction with the block diagram of FIG. 9c. The corresponding structures in FIGS. 9c and 9e are given the same reference numerals. Note that multiplexers 932 and 935 are implemented by OR-gates in FIG. 9e. This is because when the control (e.g. bit E[23] in multiplexer/OR-gate 932) is 1, the output bits desired are all 1's.

In addition, the concept illustrated by FIG. 9c is taken even one step further in OR-gate 937, corresponding to the situation when E[23], E[19] and E[18] are all 1's. OR-gate 937 provides mapping into a further 1/16 of a row of memory.

Figure 9F:
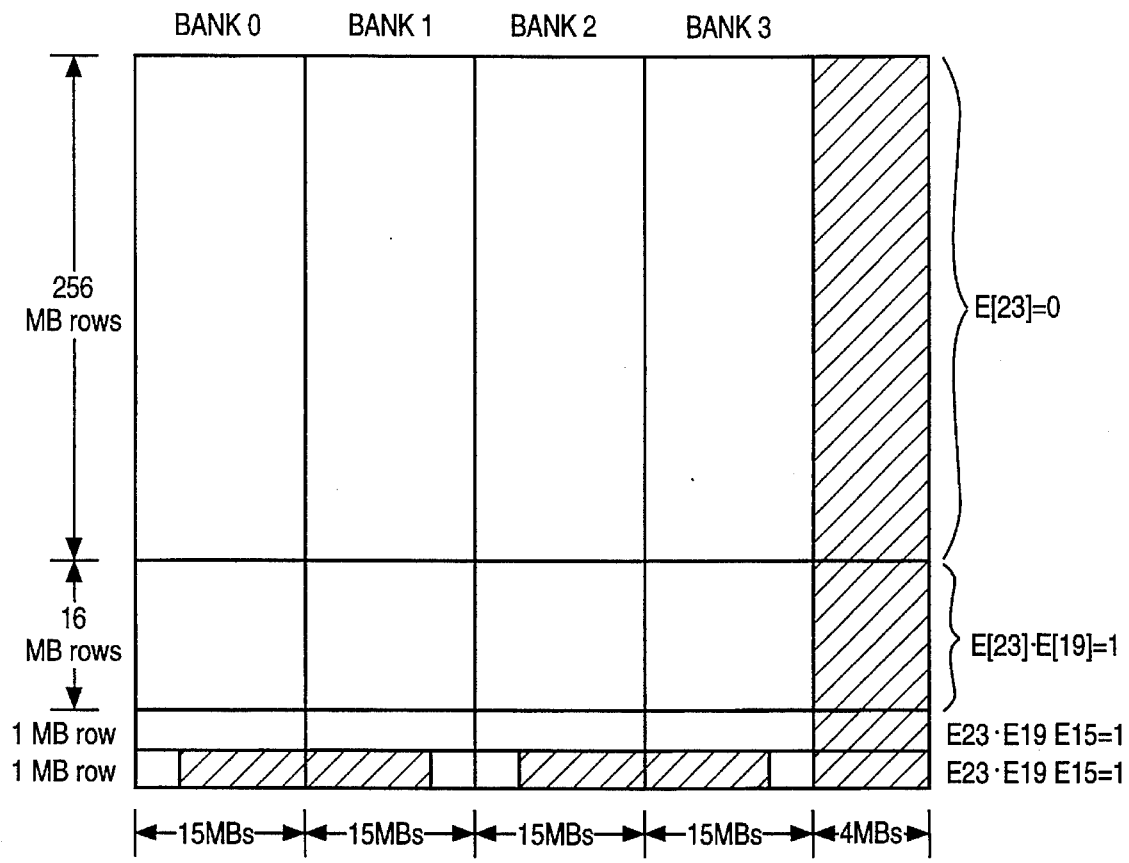
FIG. 9f shows the mapping of the DRAM byte address space into the physical DRAM address space under HDTV mode.

FIG. 9f shows in the shaded areas the mapping E[23:0] to the physical address space for Y vectors having a value at and above 1024, as described above.

Hence, the 1920 pixels×1080 pixels address space is mapped into a 8 banks of 256K×64 physical address space. Each processor maps 960×1080 pixels into 4 banks of 256K by 64-bit memory.

Decoder Coprocessor 202

Referring back to FIG. 3, the decoder 202 comprises the code memory 305, decode memory 306, decode logic 307, zigzag logic unit 308, zigzag memory 309, quantizer unit 311 and quantizer memory 310. The zig_zag logic unit 308, zig_zag memory 309, quantizer unit 311 and quantizer memory 310 can be implemented by the structures disclosed in either of the following copending applications: a) U.S. Patent Application entitled "System for Compression and Decompression of Video Data using Discrete Cosine Transform and Coding Techniques," by A. Balkanski et al., Ser. No. 07/492,242, filed Mar. 14, 1990, now U.S. Pat. No. 5,196,946, issued on Mar. 23, 1995, and assigned to C-Cube Microsystems, which is also the assignee of the present application; and b) U.S. patent application entitled "System for Compression and Decompression of Video Data Using Discrete Cosine Transform and Coding Techniques," by A. Balkanski et al., Ser. No. 07/572,198, filed Aug. 23, 1990, now U.S. Pat. No. 5,253,078, issued on Oct. 12, 1993, assigned to C-Cube Microsystems, which is also the assignee of the present application. The above copending Applications a) and b) are hereby incorporated by reference in its entirety.

The code memory 305 and the Decoder memory 306 implements FIFO memory which overflows into the external DRAM. As coded data arrive on the code bus 207, they are pushed on the FIFO. The coded data in code memory 305 are transferred 64 bytes at a time, assisted by processor 201 using an interrupt mechanism. The coded data are provided to decoder logic unit 307 for decoding. Decoder logic unit 307 generates a "pop" request when it is ready to receive the next coded datum. In one mode of the present embodiment, the code memory 305 and the decoder memory 306 are connected together. In this mode, no part of the FIFO memory reside in the external DRAM.

The low level coded data stream consists of variable length codes, having the syntax defined in the MPEG standard provided in Appendix A. The syntax of the coded data is of the type which parsing can be performed by a finite state machine. (In fact the syntax is defined in section 3 of Appendix A as a finite state machine in pseudo-code form).

Decode Logic Unit

Figure 10A:
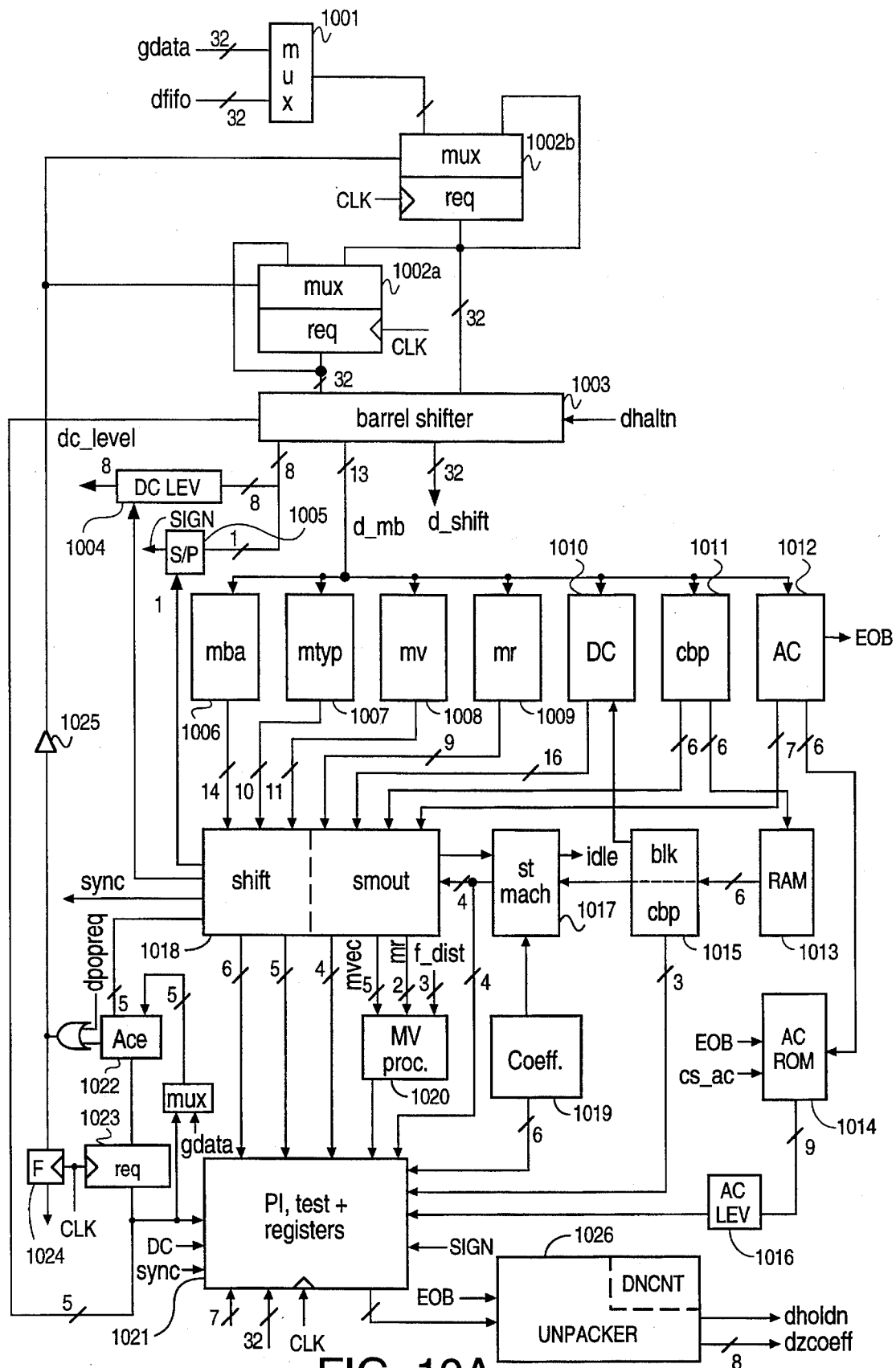
FIG. 10a is a schematic diagram of the decoder logic unit 307 of the video decompression circuit 200 shown in FIG. 2.

FIG. 10a is a schematic diagram showing the structure of decoder logic unit 307. As shown in FIG. 10a, a coded data stream is provided to register 1002b, which selectably receives as input data either the output data of multiplexer 1001 or register 1002b's own output data. Multiplexer 1001 selects between two 32-bit busses, respectively the global bus 205 and the output bus of decode memory 306. The output datum of register 1002b is provided to register 1002a as well as the lower 32-bit input bus of a barrel shifter 1003. Register 1002a receives as input data either the output data of register 1002b or register 1002a's own output data, which are provided as the higher 32-bit input data of barrel shifter 1003. The registers 1002b and 1002a respectively form the "front" and "back" registers for inputting data into barrel shifter 1003.

Figure 10B:
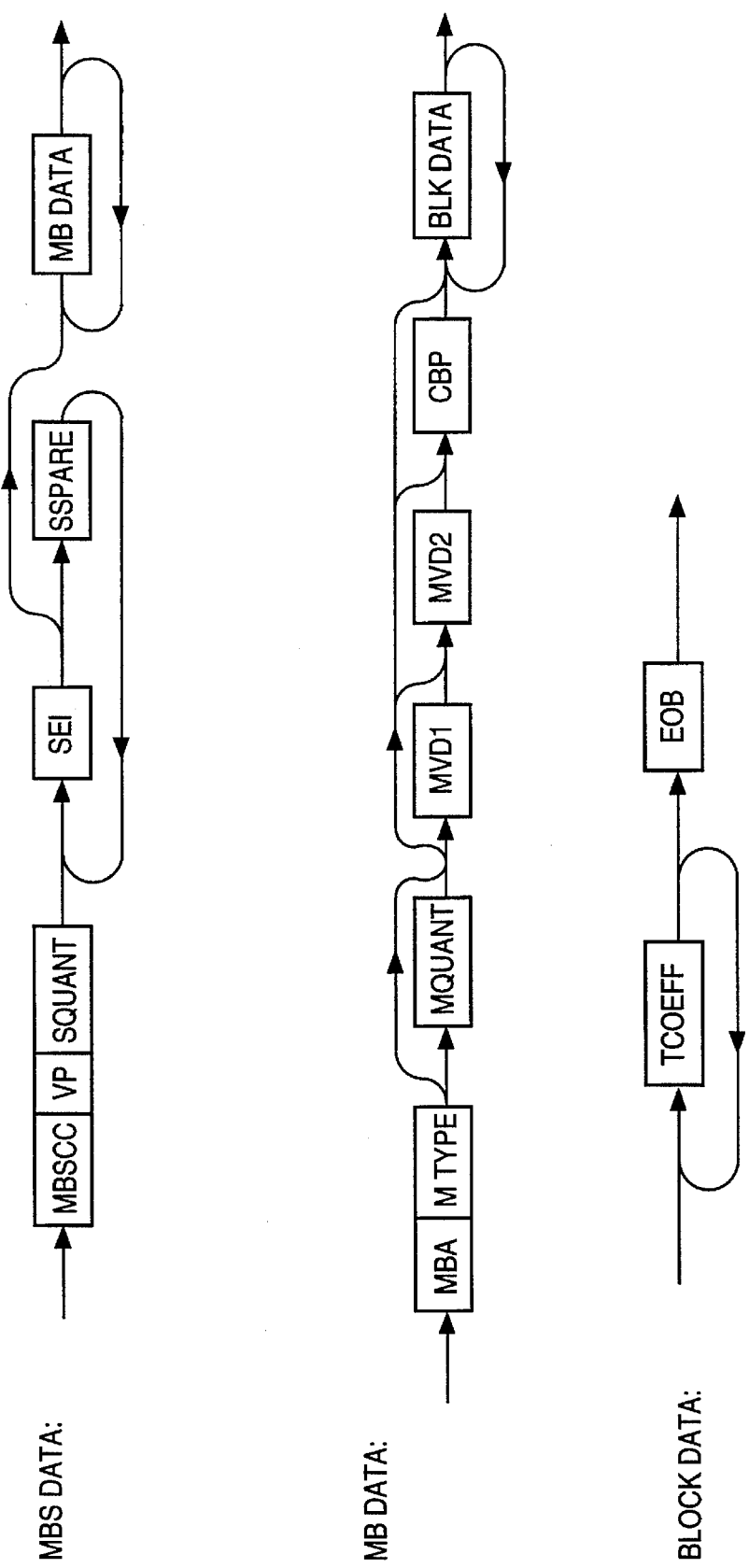
FIG. 10b is a syntax state machine showing the parsing of macroblock level variable length codes.

A parser of the coded data stream, represented by finite state machine 1017, is implemented in accordance with the MPEG standard to provide control to decoder logic unit 307. Decoder logic unit 307 decodes the macroblock level variable length code. The firmware in processor 201 decodes higher level coded data (e.g. picture level). FIG. 10b is a syntax state machine showing the parsing of macroblock level variable codes. Hence, data from the higher levels, such as frame distance and frame type are provided as input from processor 201 to decoder 307. As shown in FIG. 10a, seven types of variable codes are decoded in decoder logic unit 307 by the following decode table units: the mba (macroblock address) unit 1006, the mtype (macroblock type) unit 1007, the mv (motion vector V component) decode unit 1008, the mr (motion vector r component) decode unit 1009, the cbp (coded block pattern) decode unit 1011, the DC decode unit 1010 and the AC decode unit 1012. The last two decode units (1010 and 1012) decode block level datum, i.e. DCT coefficients. Each decode table unit examines the 13-bit output bus d_mb of the barrel shifter 1003 and provides the value and the length of the variable code decoded. Because the sizes of the tables in cbp unit 1011 and AC decode unit 1012 are larger than the tables in the other decode table units, these two table decode units 1011 and 1012 each generate, as the first step of a two-step decoding process, instead 6-bit read-only memory addresses to respectively read-only memories cbp rom 1013 and AC rom 1014. The cbp rom 1013 then outputs the requisite cbp value and the length of the cbp variable length code decoded from the 13-bit output bus d_mb of the barrel shifter 1003. Likewise, the output datum of AC rom 1014 is used to derive the AC level value and the run length in AC level unit 1016. The DC level signal is also provided to AC level unit 1016 in order that the DC_level and the AC_level can be multiplexed in the same data stream for output. Although shown in FIG. 10a outside of AC decode unit 1012, when referring to the AC decode unit in the following discussion, AC rom 1014 and AC decode unit 1016 are considered to be included in the AC decode unit 1012. Likewise, cpb unit 1011 includes cpb rom 1013.

The finite state machine 1017 keeps track of the syntax state and provides control signals to a multiplexer unit 1018 to select from amongst the output data of the decode table units 1006–1012 and forward to the appropriate destinations one of the output data and the length of the variable length code decoded. For example, the DC_decode unit 1010 provides a value indicating a size and the sign of the DC value. The sign and the value are then used in the DC level unit 1004 to extract the DC_level differential following the variable length code. The length of the variable length code decoded is provided to an accumulator 1022, which keeps track of the number of decoded bits in the front and back registers 1002a and 1002b. A pop request is generated to obtain the next 32-bit datum from the Decode memory 306 and to transfer a 32-bit datum from register 1002b to register 1002a, when necessary.

The decoded cbp value, which indicates the blocks for which transform coefficients are coded, is used for sequencing in decoding the rest of the macroblock. This sequencing is provided by block_count/cbp unit 1015. A "coeff-count" unit 1019 is provided for counting the sequence of 63 AC coefficients and 1 DC coefficient in the decoded block data stream. Thus decoder coprocessor 202 provides a bit stream in a form suitable for the IDCT unit 203. The unpacker unit 1026 expands run lengths into strings of zeroes.

The "V" and "r" components of each motion vector are decoded by the mv and mr units 1008 and 1009, and provided to the mv processing unit 1020, which is discussed next. The mv processing unit 1020 provides the motion vector in the differential motion vector format used in the motion compensation coprocessor 204.

Figure 10C:
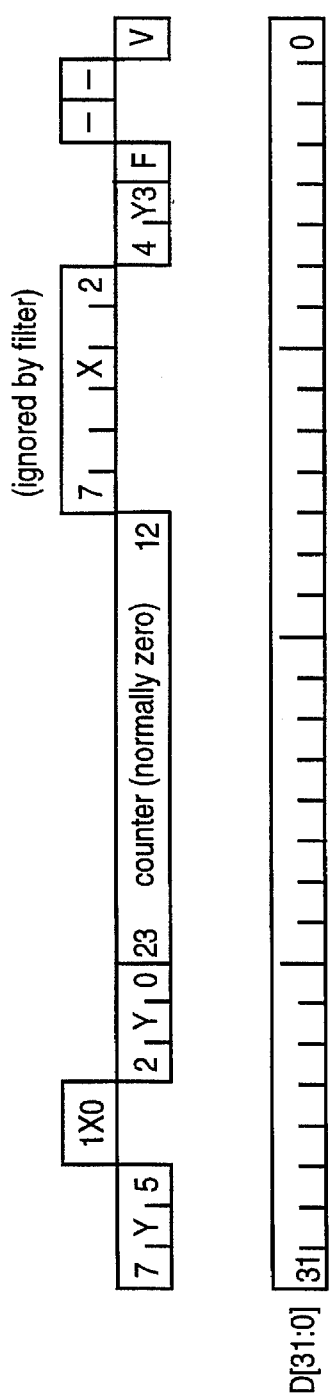
FIG. 10c shows the data representation of a differential motion vector in accordance with the present invention.

FIG. 10c shows the data representation of the motion vector in the present embodiment. As shown in FIG. 10c, a motion vector is stored in a 32-bit data word D[31:0] comprising a 8-bit horizontal component X[7:0] provided by (D[11:6],D[28:27]), an 8-bit vertical component Y[7:0] provided by (D[31:29],D[5:4],D[26:24]) if the image data is interlaced, and provided by (D[31:29],D[5:3],D[25:24]) if the image data is non-interlaced. D[3] is a parity bit indicating the field of the interlace. D[0] indicates a valid motion vector.

Motion vectors are coded differentially within a group of macroblocks, with every forward or backward motion vector coded relative to the previous motion vector of the same type. Each motion vector has a range between −16f and 15f, where f is the "frame distance", which is provided in the header of the picture group according to the MPEG syntax. A motion vector is coded in two parts, the V and the r components (see below), respectively decoded by mv decode unit 1008 and mr decode unit 1009. The decoded motion vector is reconstructed by:

$$m = p + s*[f*(V-1)+1+r]$$

where s is the sign of the motion vector f is the frame distance p is the previous motion vector V and r are the two coded components of the motion vector but if m<−16f or m>15f, $$m = p + s*[f*(V-1)+1+r]s*(31f+1)$$

Figure 10D:
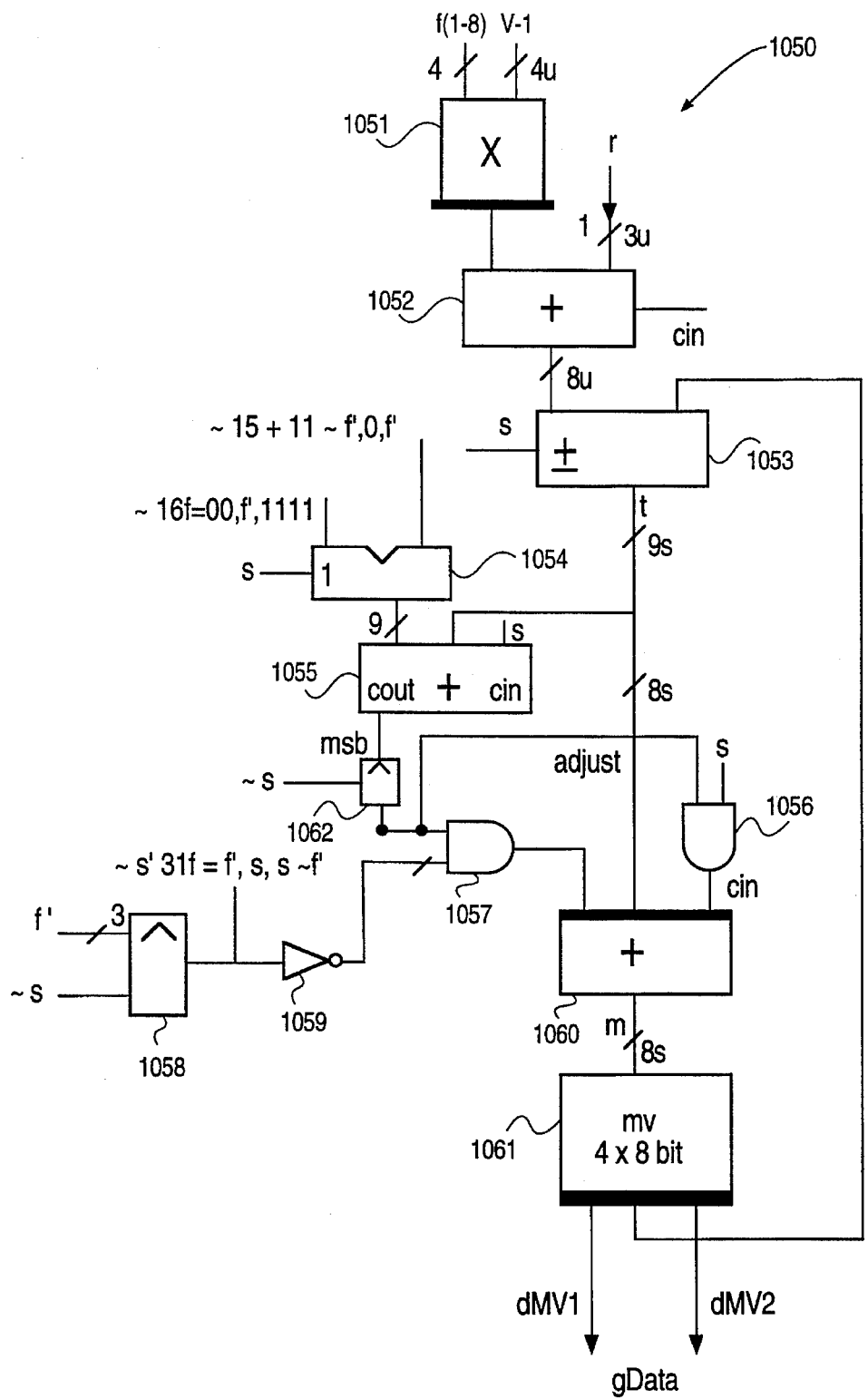
FIG. 10d is a schematic diagram of a circuit 1000 for reconstructing a motion vector from the decoded V and r components.

FIG. 10d is a schematic diagram of a circuit 1050 included in mv processing unit 1020, for reconstructing the motion vector from decoded V and r components. As shown in FIG. 10d, the frame distance f, provided as a 3-bit value, is multiplied in multiplier 1051 by the 4-bit decoded value (V−1) from the mv decode unit 1008. In this embodiment, the frame distance f used is between 1 to 8, inclusive. The 8-bit result in the multiplication of the frame distance f and the V component is then added by adder 1052 to the 3-bit r value from the mr decode unit 1009, with the carry-in bit of adder 1052 set. The 8-bit result of this addition in adder 1052 is then added to or subtracted from, according to whether the sign (provided by mv decode unit 1008) of the motion vector is positive or negative, from the previous motion vector p of the same type in adder 1053. The previous motion vector p is stored in a 4×8-bit motion Vector register file 1061. Register 1061 contains the X and Y components (8 bits each) of the previous forward and backward motion vectors.

The 9-bit signed output datum t of adder 1053 is the resulting current motion vector, provided t is in the range [−16f, 15f]. Otherwise, an adjustment is necessary. To test if t is within the requisite range, if t is positive, t is added in adder 1055 to −15f; otherwise, t is added in adder 1055 to −16f. The adjustment to t, if the value of t is not within the requisite range, is provided in adder 1060 by adding 8-bit value 31f+1 to the t value. Adjustment is enabled by AND gates 1057 and 1056, when the requisite condition occurs, as indicated by the output of Exclusive-OR gate 1062. The new motion vector m is then stored in the motion vector register file 1061, replacing the last motion vector p.

IDCT

As mentioned above, the dequantized DCT coefficients from the quantizer 311 are provided in 8×8-pixel blocks in row or column order to the IDCT unit 203 and stored in the transform memory 313 (FIG. 3). A 2-dimensional inverse discrete cosine transform is performed on each 8×8-pixels block by first performing an 8-point IDCT on each row of eight coefficients, followed by an 8-point IDCT on each column of eight coefficients to complete the 2-dimensional IDCT on the block. After clipping, the IDCT coefficients are each represented in 9 bits, and range between −256 and 255.

Both copending applications Ser. Nos. 07/492,242 and 07/572,198, incorporated by reference above, describe structures for performing IDCT also suitable for use, and in fact used, in IDCT coprocessor 203 of the present embodiment.

Motion Compensation Coprocessor 204

The motion compensation Coprocessor 204 reconstructs predicted and interpolated pictures using motion vectors and reference frames constructed from previous intra or predicted pictures. Motion compensation is directed by the firmware in processor 205 by a motion compensation task. The motion compensation task in processor 205 operates in five phases. The first and second phases respectively fetch from the external DRAM into the pixel memory 317 the upper and lower parts of a motion compensated reference macroblock in the previous predicted or intra frame (forward motion vector). Then, in the third and fourth phases, the upper and lower parts of a reference macroblock from the next predicted or intra frame (backward motion vector) are fetched from the external DRAM into the pixel memory 317 and interpolated with the macroblock of the previous frame fetched in the first and second phases. In the final phase, the current macroblock is fetched from block memory 314 and added to the macroblock in pixel memory.

In order to compute addresses of the motion compensated reference macroblocks, the higher order four bits (Y[7:4]) of the Y-component in the motion vector must be multiplied by the width of the screen. To facilitate this multiplication, as mentioned above, the decoding of the "jump target" field in processor 205's instruction set is modified when the "branch never" condition (i.e. no branch) is specified. The next section explains four instructions MV_LOAD, MV1, MV2 and MV3 in the jump target field designed to facilitate the multiplication of the width of the screen to the higher order four bits of the Y motion vector.

Special Instructions

In 2's complement representation, a multiplication by four bits, performed one bit at a time, requires four sum operations. However, if the one-bit multiplication is performed in ternary (base 3) arithmetic, only three sum operations are necessary. The four bits of the Y-component of the motion vector have a value which ranges from −8 to 7, and can be represented by three ternary digits (each ternary digit can take one of three values: −1, 0, 1). The ternary-digit multiplication of the motion vector can be seen by the following formulation (the 4-bit value Val represented by ternary digits $D_9, D_3, D_1$, where $Val = D_9*9 + D_3*3 + D_1$):

$$\begin{aligned} base + width*Val &= Base + Width*D_9*9 + \\ &\quad Width*D_3*3 + Width*D_1 \\ &= Base + (Width*9)*D_9 + \\ &\quad (Width*3)*D_3 + Width*D_1 \end{aligned}$$

Since multiplying a value by −1, 0, or 1 is respectively negating the value, zeroing and or leaving the value unchanged, which are relatively trivial operations to implement. That is, the above computation can be implemented in three summing steps if the multiplication is achieved in the operand fetch phase, i.e. the fetching step either negates, zeroes or leaving unchanged the precomputed operands of (width*9), (width*3) or width. Therefore, the address computation above can be performed in the following code segment (specifically, by the ADD instructions):

| <any instruction> | BN | MVLOAD | /* | specifying "branch never" and setting up the ternary digits of the Y_motion vector */ |
|---|---|---|---|---|
| NOOP | BN | MV1 | /* | set up first phase of mv multiply */ |
| ADD ADDR,width,ADDR | BN | MV2 | /* | add ternary-digit modified "width" to content of ADDR and set up second phase */ |
| ADD ADDR,width3,ADDR | BN | MV3 | /* | add ternary-digit modified "width3" to content of ADDR and set up third phase */ |
| ADD ADDR,width9,ADDR | | | /* | add ternary-digit modified "width9" and done! */ |

It will be appreciated that the special instructions MVLOAD, MV1, MV2 and MV3 modifies the execution of not the immediate instruction, but the instruction following. FIG. 11a shows a circuit for providing the control signals "0", "–" and "*" for implementing the three phases of the special motion vector computation using instructions MV1, MV2 and MV3. The control signal "0" indicates that the "width" ("width3," or "width9") operand should be zeroed, the control signal "–" indicates that the "width" operand should be negated. (Hence, "0" and "–" cannot both be asserted at the same time). The "*" control signal further specifies that, under certain conditions explained below, the value of the appropriate "width9," "width3" or "width" should be fetched from an alternative register.

As shown in FIG. 11a, a decode circuit 1101 detects in the current instruction both the "branch never" condition and one of the special instructions MVLOAD, MV1, MV2, or MV3 for modification of the next instruction. When MVLOAD is detected (control signal MVSEL=00), the higher order 4 bits (Y[7:4]) of the ALU 303's output bus is latched into the register MVYH. When either MV1, MV2 or MV3 (MVSEL=01, 10 or 11 respectively) is detected, the control signals MVSEL, together with the content of register MVYH indexes into a table 1103 containing 3-bit values. The 3 bits in each 3-bit value are respectively the values of the "0", "–" "," control signals In the present embodiment, if the computation of the motion vector yields an address beyond the current macroblock, as indicated by the overflow circuit 1104 and exclusive-OR gate 1106, the "*" control signal is propagated by AND gate 1107. The "*" control signal is explained below.

The "0", "–" and "*" control signals are propagated by register 1105 to effectuate the operand modification. The contents of table 1103 are tabulated in table 1150.

Figure 11B:
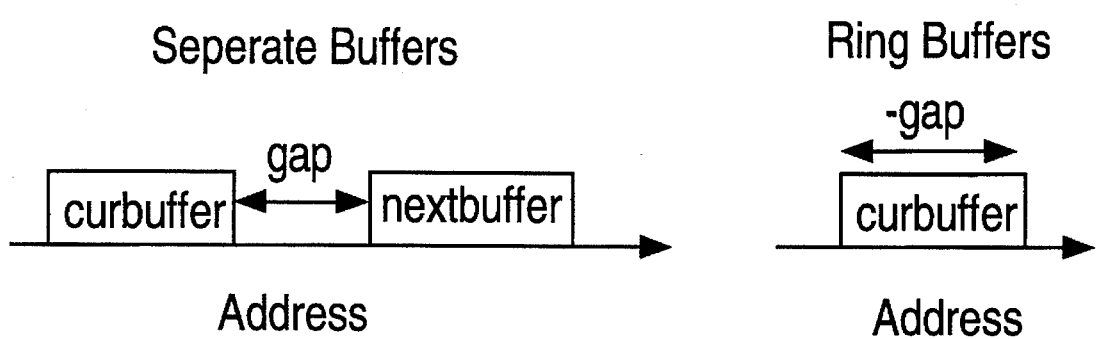
FIG. 11b shows non-contiguous buffer and ring buffer implementations of a video memory.

In the present embodiment, macroblocks in a field or frame may not be stored contiguously in memory. This condition arises if adjacent slices of macroblocks are stored in buffers separated by a "gap", or in a ring buffer (both conditions are shown in FIG. 11b). When the current motion vector reaches outside of the current macroblock slice, as detected by the overflow circuit 1104 and exclusive-OR gate 1106, the "*" control signal directs the operand fetch to an alternate register (physically, the alternate register is also a register in register file 302 of FIG. 3 but having an address one greater than the specified register). The content of the alternate register is the value of the width to be fetch augmented by the size of the gap.

Block Memory

The block memory unit 314 stores and reorders each macroblock of data. Data arrives in 8×8-pixel blocks of one luminance (Y) or Chrominance (U or V) type. However, for video output purpose, the pixels are provided in pixel pairs, consisting of two Y pixels and the U and V pixels in the same picture area. Data arrives from IDCT coprocessor 203 one byte per clock on the average, at four-clock bursts during which two bytes are transferred per clock period. In the present embodiment, three banks of SRAM are provided. Bank0, which is 128×16-bit, is designed to contain four blocks of Y data, and banks Bank1 and Bank2, each 64×8-bit, are designed for storing one block of U or V data.

In the present embodiment, as data of the current macroblock arrives and are written into the block memory 314, the data of the previous macroblock are read out. In accordance with the present invention, block memory unit 314 is written and read out in cycles of the four patterns described below. Under this four-pattern scheme, data in the current macroblock is always written into a location at which data of the last macroblock have already been read. Therefore, double-buffering to prevent writing into a memory location before the last datum is read out is not necessary under this scheme. As a result, a 50% reduction in memory requirement is achieved.

FIGS. 12a–d illustrate the memory access pattern in accordance with the present invention. In each of FIGS. 12a–d, each vertical column 00–17 (octal) represents one column of a 8×8-pixel block, each column being a picture area of 2 pixels×8 pixels. The numbering of these vertical columns represents the order in which the pixels are received from the IDCT coprocessor 203 (2 bytes per clock period over 4-clock period bursts).

FIG. 12a shows the "pattern 0" access pattern. The columns 01–04 in the first quadrant represents the first 8×8-pixels block of Y data. Likewise, the other three Y blocks are represented by columns 04–07, 10–13, and 14–17. In pattern 0, the vertical columns are stored at sequential memory addresses (each column being offset by 8 16-bit words, hence sequential in the address bits specifying eighth words). However, the macroblock written under pattern 0 has to be read in the order 00, 10, 01, 11, . . . , 07, 17, in order that the 16×16-pixel macroblock can be read out in column order. Hence, as pattern 0 data are read out, the incoming data ("pattern 1") are directed to occupy the locations vacated by pattern 0. For example, the first four pattern 0 columns to be read out are 00, 10, 01, 11, which are replaced respectively by columns 00, 01, 02, and 03 of the next macroblock ("pattern 1").

The distribution of pattern Z columns is shown in FIG. 12b. As in pattern 0 columns, after pattern 1 columns are completely written, pattern 1 columns are read in the order 00, 10, 01, 11, 02, 12, . . . , 07, 17 and respectively replaced by the next macroblock's ("pattern 2") columns 00, 01, 02, 03, . . . , 16, 17. Pattern 2 is shown in FIG. 12c. Likewise, the columns of pattern 2 gives way to the columns of the next macroblock ("pattern 3"), which is shown in FIG. 12d. The columns of pattern 3 are read in the order in which the columns of pattern 0 are written. Hence, such memory access patterns can continue indefinitely in cycles of patterns 0–3. Because, in each of the memory access patterns 0–3, every memory location is read before it is written, block memory unit 314 need only be the size of one macroblock, and reordering is accomplished without double buffering.

The memory addresses for memory access patterns 0–3 can be generated by a counter which counts in sequential order during pattern 0 access, in the order (0,8,1,9,2,10,3, 11,4,12,5,13,6,14, 7,15) during pattern 1 access, in the order (0,4,8,12,1,5,9,13, 2,6,10,14, 3,7,13,17) during pattern 2 access, and in the order (0,2,4,6,8,10,12,14,1,5,3,7,11,15) during pattern 3 access. The counts in patterns 0, 1, 2, and 3 can be generated by a 4-bit counter which counts by: 1) rotating to the left the four count bits in a wrap-around fashion 0, 1, 2 or 3 bits, in accordance with whether memory access pattern 0, 1, 2 or 3 is desired; 2) incrementing by 1 the 4-bit counter in its rotated position; and 3) rotating to the right the number of bits rotated in step 1) (i.e. returning to original bit positions).

Figure 12F:
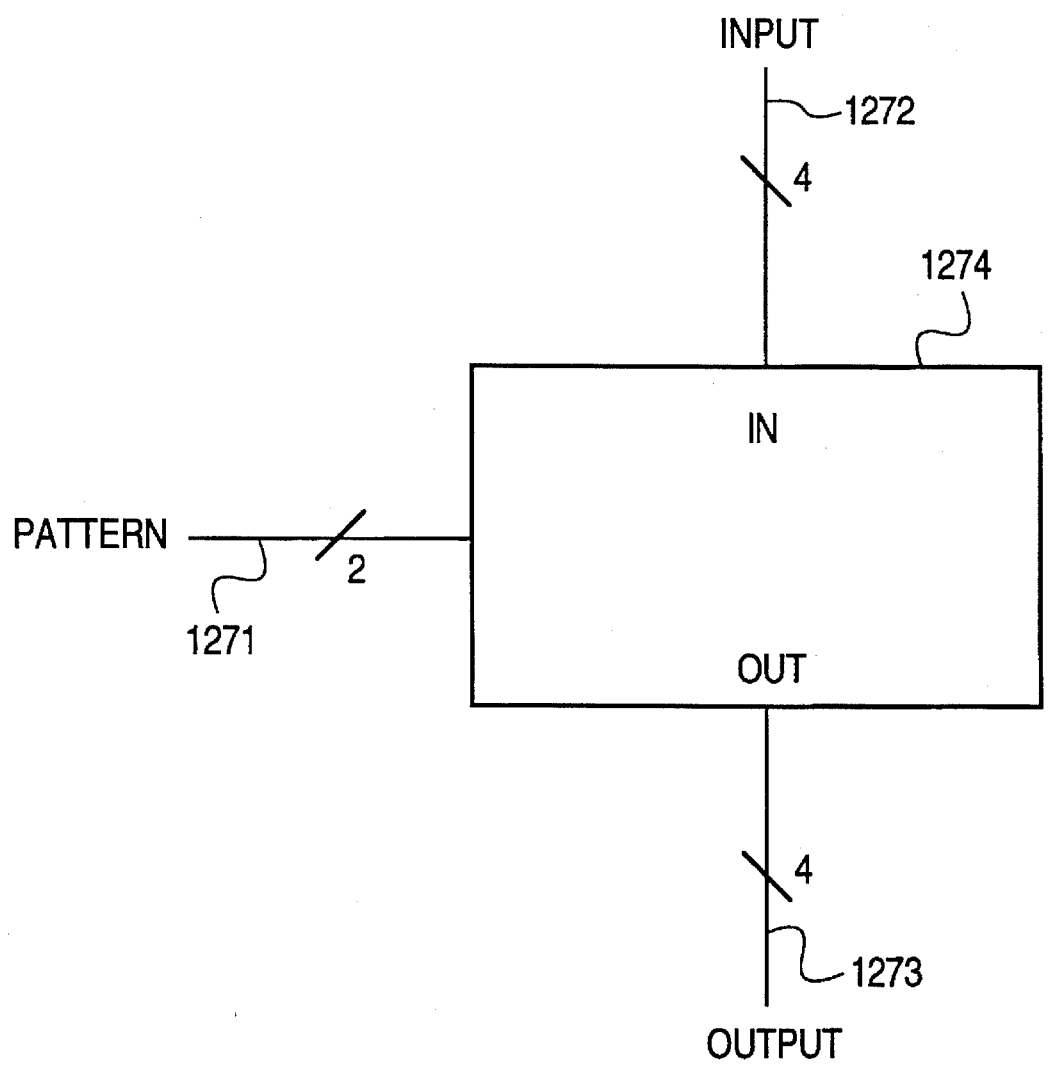
FIG. 12f shows a counter for generating the addresses for implementing the memory access patterns 0–3 of the present invention.

FIG. 12f shows a counter 1274 for implementing the bit rotation function. As shown in FIG. 12f, four bits of the pixel address or pixel count are provided in a 4-bit bus 1272 as an input datum to counter 1274. A 2-bit control directs counter 1274 to generate the count for each of the patterns 0–3. The 4-bit output bus 1273 provides the rotated 4-bit patterns. The bit patterns of the counts corresponding to memory access patterns 0, 1, and 2 are shown in FIG. 12e.

Motion Compensation

Figure 13A:
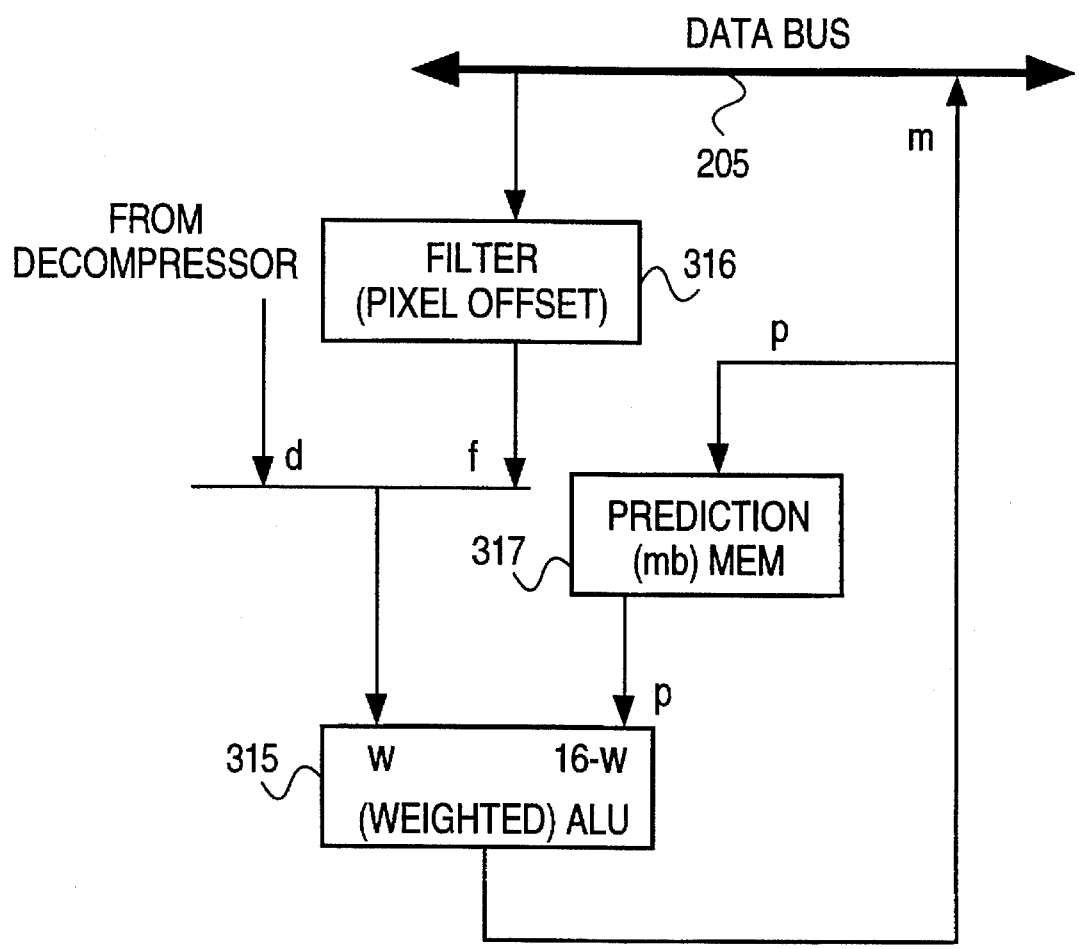
FIG. 13a shows the data flow path through the motion compensation units 315–317.

The motion compensation function is implemented in the present embodiment in the pixel filter unit 316, the prediction or pixel memory unit 317 and the weighted adder or ALU unit 315. The data flow path through the motion compensation units 315–317 is shown in FIG. 13a.

As mentioned above, in the first and second phases of the motion compensation operation, first and second parts of a macroblock of the forward reference frame are fetched from DRAM, provided over the global bus 205 at a rate of two Y pixels and two chrominance pixel per clock period, and placed in the pixel memory 317. In the non-interlaced 4:2:0 mode, since the chrominance data are subsampled in the Y direction, new chrominance data arrive every other clock period (the two chrominance values arriving at a clock period when no new chrominance data are provided are duplicates of the previous two chrominance values). In fetching this macroblock from the external DRAM, processor 205 provides the first order motion compensation in the computation of the macroblock address, which is computed in the manner discussed in conjunction with the special instructions MVLOAD, MV1, MV2 and MV3 discussed above. Pixel Filter 316 provides the resampling of the pixels fetched to half-pixel or quarter-pixel locations, using the lower order bits X[1:0] and Y[1:0] of the X and Y components of the motion vector.

Figure 13B:
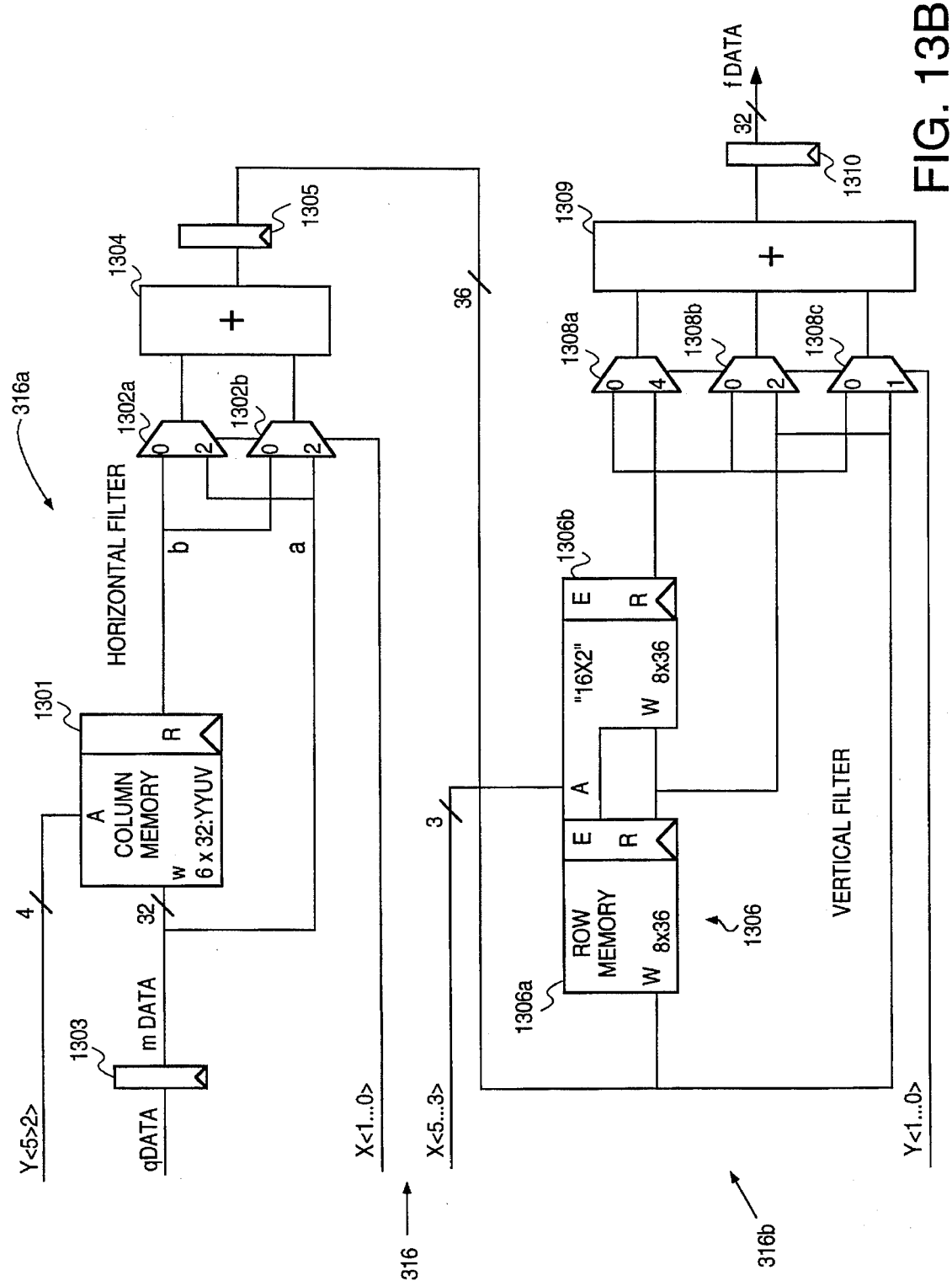
FIG. 13b is a schematic diagram of pixel filter unit 316.

In the third and fourth phases of motion compensation, a macroblock in the backward reference frame is fetched in a similar manner as the macroblock from the forward reference frame, and likewise resampled in the Pixel Filter 316. As the pixels of the macroblock from the backward reference frame are resampled, they are forwarded to the weighted adder to linearly combine with corresponding pixels in the macroblock from the forward reference frame fetched in the first and second phases to form the pixels of an interpolated prediction of the current macroblock. The pixels of the interpolated prediction are then stored back to the Pixel Memory 317. In the final phase, a macroblock of decompressed data is received from the block memory unit 314 and summed with the interpolated prediction macroblock to form the final values of the current macroblock. This current macroblock is then written back into the external DRAM for video output. The Pixel Filter unit 316 is a 2×2 resampler. FIG. 13b is a schematic diagram of the circuit implementing the 2×2 resampler of the Pixel Filter unit 316. As shown in FIG. 13b, the Pixel Filter unit 316 comprises a horizontal filter 316a and a vertical filter 316b. The horizontal filter 316a comprises a 16×32-bit column memory 1301, the input latch 1303, multiplexers 1302a and 1302b, an output latch 1305 and an adder 1304. Multiplexers 1302a and 1302b, together with adder 1304 forms a weighted adder (hereinafter, collectively referred to as weighted adder 1304). The weighted adder 1304 can provide in the resulting sum 1:0, ½:½ or 0:1 weighting of its two input data a and b. The vertical filter unit 316b comprises a 2×8×36-bit row memory unit 1306, multiplexers 1308a, 1308b and 1308c, and adder 1309, and an output register 1310. The row memory unit 1306 can be further divided into two planes 1306a and 1306b, each organized as 8×36-bit. Again, multiplexers 1308a–c and adder 1309 forms a weighted adder (hereinafter, collectively referred to as weighted adder 1309). The weighted adder 1309 can provide 1:0, ½:½, ¾:¼, ¼:¾ or 0:1 weights of its two input data a and b, which are selected from the current pixel pair and either the pixel pair in the previous row, or the pixel pair in the row above the immediately previous row.

Every clock period, a pixel pair arrives in column order (each column is a 2×18 group of pixels, since a reference macro block needs a 18×18-pixel picture area in other to provide a complete context for the resampling in the pixel filter 316) on the global bus 205 and is latched into the input latch 1303. Each pair of pixels are stored in one of 16 locations of the 16×32-bit column memory 1301 specified by the bits Y[5:2] in the Y component of the motion vector. As a pixel pair of a new column arrive at the column memory 1301, a pixel pair in the corresponding position in the previous column is read out. The current pixel pair and the corresponding pixel pair from the previous column are then combined at the weighted adder 1304, the weights accorded each pixel pair is determined by the lower order two bits (i.e. X[1:0]) of the X component of the motion vector. The result of this weighted addition is a new pixel pair positioned between the input pixel pairs (i.e. horizontally resampled). The new pixel pair (9-bit precision) is then latched into register 1305 to be forwarded to the vertical filter unit 316b. Hence, the column memory 1301 acts as the delay element of a 2-tap filter. The output data of the horizontal filter 316a are discarded during the time period when the data of the first column in each macroblock are input at the Pixel Filter 316.

The row memory 1306 provides vertical resampling of the macroblock. The row memory 1306 is organized as two planes 130a and 130b each holding eight 36-bit words. The first plane 1306a contains one pixel pair per column, being the most recent pixel pair in the column prior to the current pixel pair. The second plane 1306b also contains one pixel pair per column, being the second most recent pixel pair in the column prior to the current pixel pair. As the current pixel pair arrives, memory planes 1306a and 1306b are each read for the pixel pair in the same column. A new pixel pair is provided by weighted adder 1309 as a weighted sum of the current pixel pair and either the most recent pixel pair in the same column (delayed one clock period) or the second most recent pixel pair in the same column (delayed two clock periods). The weights to accord the current pixel pair and the selected previous pixel pair are specified by the lower two bits (Y[1:0]) of Y-component in the motion vector. In the interlaced mode, resampling of the current pixel pair is performed with respect to the pixel pair delayed two clock periods. The new pair of pixels are then latched into the register 1310, for transfer into the Pixel Memory unit 317, via weighted adder 315.

Figure 13C:
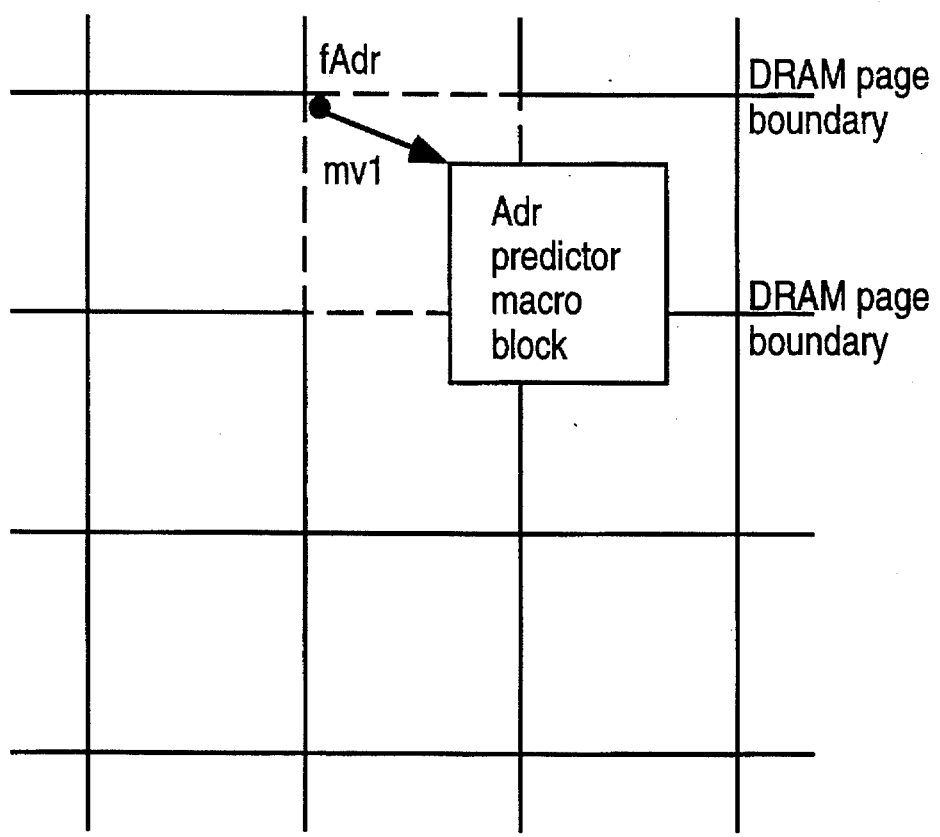
FIG. 13c shows a motion vector mvl yielding a predictor macroblock which maps into an area in the external DRAM spanning DRAM page boundaries.

A motion vector can provide a predicted macroblock not aligned to the page boundaries of the external DRAM. Since the pixels are fetched in column order and there are 16 pixels in a row of pixels of a macroblock, fetching a macroblock potentially requires crossing a DRAM page boundary sixteen times. FIG. 13*c* shows a motion vector mv1 yielding a predicted macroblock which is not aligned to the DRAM page boundaries. Recalling that the initial access to a DRAM page requires six to seven clock periods, and subsequence accesses to the same page can be achieved in page mode every other clock period, much efficiency can be achieved if the sixteen DRAM page crossings can be reduced. Such efficiency is achieved, in accordance with the present invention, by fetching the macroblock in two parts. This method is illustrated by FIG. 13*d*.

Figure 13D:
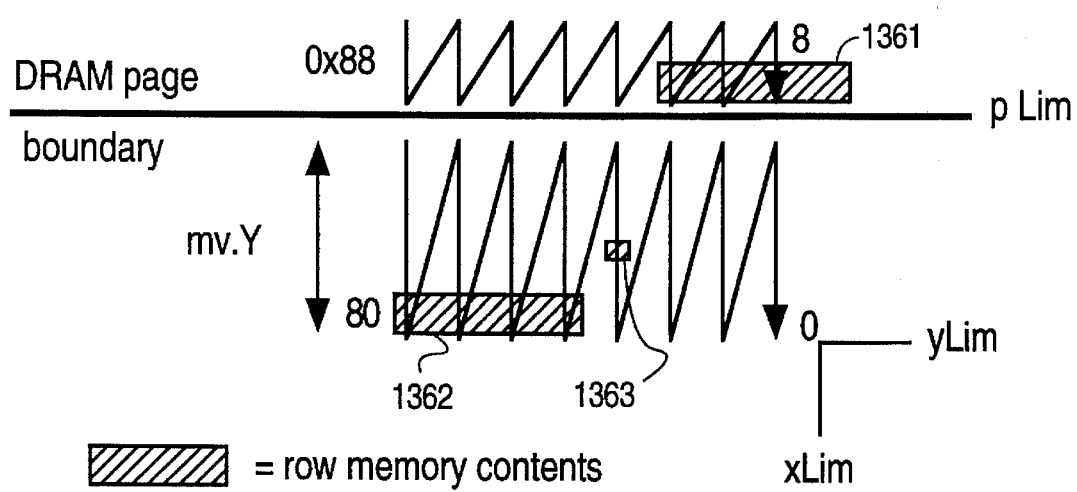
FIG. 13d shows the content of the row memory 1306 and the two-part memory access pattern in which the pixels of a macroblock are fetched.

Under the method illustrated in FIG. 13*d*, the macroblock is fetched in two parts. In the first phase (the third phase, if the macroblock is coded with respect to a backward reference frame) of motion compensation, the part of the macroblock above the horizontal DRAM boundary is fetched in column order. However, when the DRAM boundary is reached in each column, instead of crossing the DRAM boundary to fetch the next pixel pair of the column, the first pixel pair of the next column is fetched. The last two pixel pairs above the DRAM boundary are allowed to remain in row memory of the Pixel Filter unit 316 until the next phase of motion compensation. The first phase is completed when the part of the macroblock above the horizontal boundary in all columns is fetched.

In the second phase (the fourth phase, if the macroblock is coded with respect to a backward reference frame), the second part (i.e. the part of the macroblock below the horizontal DRAM page boundary) of the macroblock is fetched, beginning with the first pixel pair below the DRAM page boundary in the first column. After the remaining pixel pairs in the first column are fetched, the remaining pixel pairs of the second column are fetched, and so forth. The second phase is completed when all remaining pixel pairs below the DRAM page boundary in all columns are fetched. FIG. 13*d* shows the memory access patterns for the first (above the horizontal DRAM page boundary) and the second (below the horizontal DRAM page boundary) parts of the macroblock access, and in particular at the instance during the second phase at which just over one half of the pixel pairs in the second part of the macroblock are fetched. As shown in FIG. 13*d*, the row memory unit 1306 contains, for each of the last three columns of the macroblock, the last two pixel pairs (indicated by the shaded box 1361) above the horizontal DRAM page boundary in the columns fetched during the first phase. FIG. 13*d* also shows that the row memory unit 1306 contains, for the first four columns, the last two pixel pairs (indicated by shaded box 1362) below the horizontal DRAM page boundary in each column. In FIG. 13*d*, the current content of the row memory unit 1306, for the fifth column of the macroblock, are the two most recent pixel pairs received prior to the current pixel pair. Hence, by fetching the macroblock in two parts, with respect to horizontal page boundaries, only two initial access time costs are incurred, thereby resulting in a substantial saving of memory access time per macroblock fetched.

Figure 14:
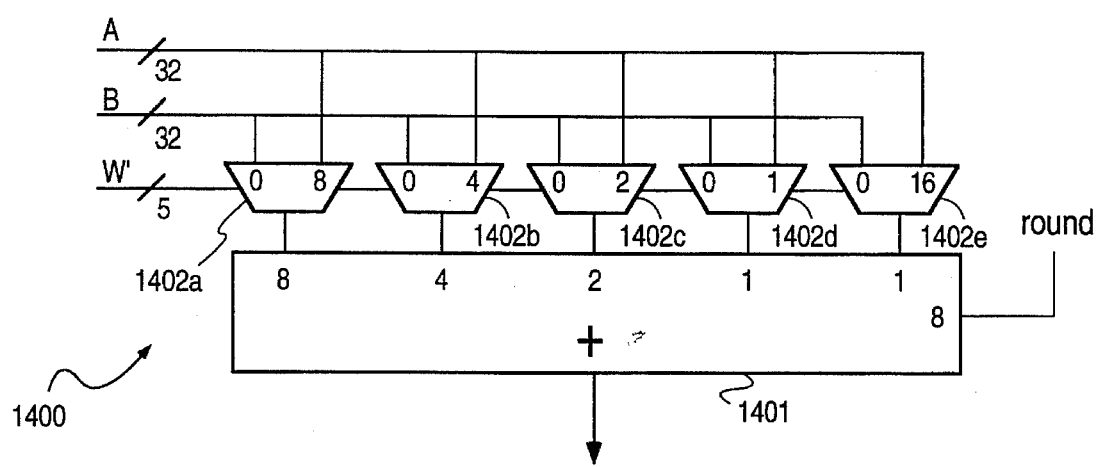
FIG. 14 shows a circuit 1400 for implementing the bilinear interpolator in the weighted adder 316 of the present embodiment.

The weighted adder 316 is a bilinear interpolator of two pairs of pixels (a,b), providing an output datum having a value $(w*a+(16-w)*b+8)/16$. The third operand "8" is provided for rounding purpose. A circuit 1400 is shown in FIG. 14 to implement this bilinear interpolator. As shown in FIG. 14, circuit 1400 comprises 5-input adder 1401, and five multiplexers 1402*a–e*. Each multiplexer 1402*a–e*, in addition to selecting one of the two input data A and B at its input terminals, provides to the output datum the weight indicated on the multiplexer, by shifting to the left the input datum a number of bits equal to the base 2 logarithm ($\log_2 w$) of the weight. For example, multiplexer 1402*a* selects and shifts to the left three bits ($\log_2 8$) the 32-bit A input datum, if bit 3 of the 5-bit control value w'[4:0] is 1. (Control value w' equals w for $0 \leq w < 16$ and equals 31 when w=16) By so shifting, multiplexer 1402*a* provides a weight of 8 to the A-input datum during the summing operation of adder 1401, and a weight of 0 to the B-input datum. Conversely, if bit 4 of the control value w' is 0, the 32-bit B-input datum is given a weight of 8, and the A-input datum of multiplexer 1402*a* is provided a weight of 0.

The operations of multiplexers 1402*b–e* are similar, with the weights accorded to the selected input data, respectively, 4, 2, 1 and 1, controlled by the bits 2, 1, 0 and 4 of the control value w'. Since multiplexers 1402*a–e* each accord a designated weight to either the A-input datum or the B-input datum, the total weight accorded by all the multiplexers 1402*a–e* to the A-input datum must equal to the total available weights (i.e. 16) minus the total weight accorded the B datum. Therefore, the resulted weighted sum, before rounding, must equal $w*a+(16-w)*b/16$. The final division by 16 is accomplished by shifting the resulting sum to the right 4 bits.

There is a special case when all the weights are assigned to the A-input datum. In that situation, where w=16, 5-bit control value w' is given the value 31, which enables each multiplexer 14*a–e* select the A-input datum.

Video Output

The video output unit comprises a 64×32-bit video memory 319 (FIG. 3), for storing video output. The video data are output in the order of the horizontal lines in a display. Hence, pixel data are fetched from the video memory of the external DRAM in scan format as discussed above. The data format follows the CCIR 601 standard ($C_b Y C_r Y$, i.e. UYVY). A horizontal resampler 318 is provided to interpolate horizontally by a factor of 2, using a bilinear filter.

The above detailed description is intended to illustrate the specific embodiments provided herein and not intended to limit the present invention. One skilled in the art will be able to provide numerous variations and modifications within the scope of the present invention upon consideration of the above detailed description and the accompanying drawings. The present invention is defined by the following claims.

We claim:

1. An apparatus for decompressing coded compressed video signal, said apparatus being coupled to a memory, said apparatus comprising:

a bus, coupled to said memory, said bus providing read and write accesses to said memory;

a first-in-first-out (FIFO) buffer for receiving from said memory via said bus compressed video signals, said compressed video signals encoded by variable-length codes;

a decoding circuit, coupled to said FIFO buffer, for decoding the variable-length codes of said coded compressed video signals received from said FIFO buffer;

an inverse discrete cosine transform (IDCT) circuit, receiving said decoded video signals, for performing an inverse discrete cosine transform on said decoded video signals, and for providing said transformed video signals on said bus;

a motion compensation circuit, coupled to receive said transformed video signals from said bus and coupled to receive over said bus reference frames from said memory, said motion compensation circuit reconstructing video signals using said reference frames to further decode said transformed video signals, and storing said reconstructed video signals in said memory via said bus; and a memory controller, coupled to said memory, said FIFO, said IDCT circuit, and said motion compensation circuit, for controlling memory access over said bus by said FIFO, said IDCT circuit, and said motion compensation circuit, in accordance with a predetermined priority scheme.

2. An apparatus as in claim 1, further comprising a processor for controlling said decoding circuit, said inverse discrete cosine transform circuit and said motion compensation circuit, said processor accessing over said bus instructions stored in said memory.

3. An apparatus as in claim 2, wherein said processor controls said decoding circuit, said inverse cosine transform circuit, and said motion compensation circuit by accessing, over said bus, control and data registers of said decoding circuit, said inverse cosine transform circuit, and said motion compensation circuit.

4. An apparatus as in claim 1, wherein a portion of said bus comprises a host bus for communication with a host computer.

* * * * *